US012378109B2

(12) United States Patent
Hong et al.

(10) Patent No.: US 12,378,109 B2
(45) Date of Patent: Aug. 5, 2025

(54) CHARGE TRANSFER CIRCUITRY FOR MEMS DEVICES

(71) Applicant: Obsidian Sensors, Inc., San Diego, CA (US)

(72) Inventors: John Hong, San Diego, CA (US);
Tallis Chang, San Diego, CA (US);
Bing Wen, San Diego, CA (US);
Edward Chan, San Diego, CA (US);
Sean Andrews, San Diego, CA (US);
Heesun Shin, San Diego, CA (US)

(73) Assignee: Obsidian Sensors, Inc., San Diego, CA (US)

( * ) Notice: Subject to any disclaimer, the term of this patent is extended or adjusted under 35 U.S.C. 154(b) by 261 days.

(21) Appl. No.: 17/896,978

(22) Filed: Aug. 26, 2022

(65) Prior Publication Data

US 2023/0061174 A1    Mar. 2, 2023

Related U.S. Application Data

(60) Provisional application No. 63/237,496, filed on Aug. 26, 2021.

(51) Int. Cl.
*B81B 7/02* (2006.01)
*B81C 1/00* (2006.01)

(52) U.S. Cl.
CPC ............ *B81B 7/02* (2013.01); *B81C 1/00015* (2013.01); *B81B 2201/042* (2013.01); *B81B 2203/0127* (2013.01); *B81B 2203/0163* (2013.01); *B81B 2203/0353* (2013.01); *B81B 2203/04* (2013.01); *B81B 2207/01* (2013.01); *B81B 2207/03* (2013.01); *B81C 2201/0135* (2013.01); *B81C 2201/0156* (2013.01)

(58) Field of Classification Search
CPC ................ B81B 7/02; B81B 2201/042; B81B 2203/0127; B81B 2203/0163; B81B 2203/0353; B81B 2203/04; B81B 2207/01; B81B 2207/03; B81C 2201/0135; B81C 2201/0156; B81C 1/00015
USPC ............... 359/199.2, 200.6, 212.1, 290, 291
See application file for complete search history.

(56) References Cited

U.S. PATENT DOCUMENTS

| | | | | |
|---|---|---|---|---|
| 2009/0289606 | A1* | 11/2009 | Lauxtermann | G09G 3/3433 318/116 |
| 2015/0277099 | A1* | 10/2015 | Hong | G09G 3/2003 438/57 |
| 2016/0103515 | A1* | 4/2016 | Seo | G02B 26/001 359/291 |

* cited by examiner

*Primary Examiner* — William Choi
(74) *Attorney, Agent, or Firm* — Procopio, Cory, Hargreaves & Savitch LLP

(57) ABSTRACT

Microelectromechanical system (MEMS) devices, methods of operating the MEMS device, and methods of manufacturing the MEMS device are disclosed. In some embodiments, the MEMS device includes a glass substrate; an electrode on the glass substrate; a hinge mechanically coupled to the electrode; a membrane mirror mechanically coupled to the hinge; a TFT on the glass substrate and electrically coupled to the electrode; and a control circuit comprising: a multiplexer configured to turn on or turn off the TFT; and a drive source configured to provide a drive signal for charging the electrode through the TFT. An amplitude of the drive signal corresponds to an amount of charge, and the amount of charge generates an electrostatic force for actuating the hinge and a portion of the membrane mirror mechanically coupled to the hinge. In some embodiments, the MEMS devices comprise a charge transfer circuit for providing the amount of charge.

15 Claims, 14 Drawing Sheets

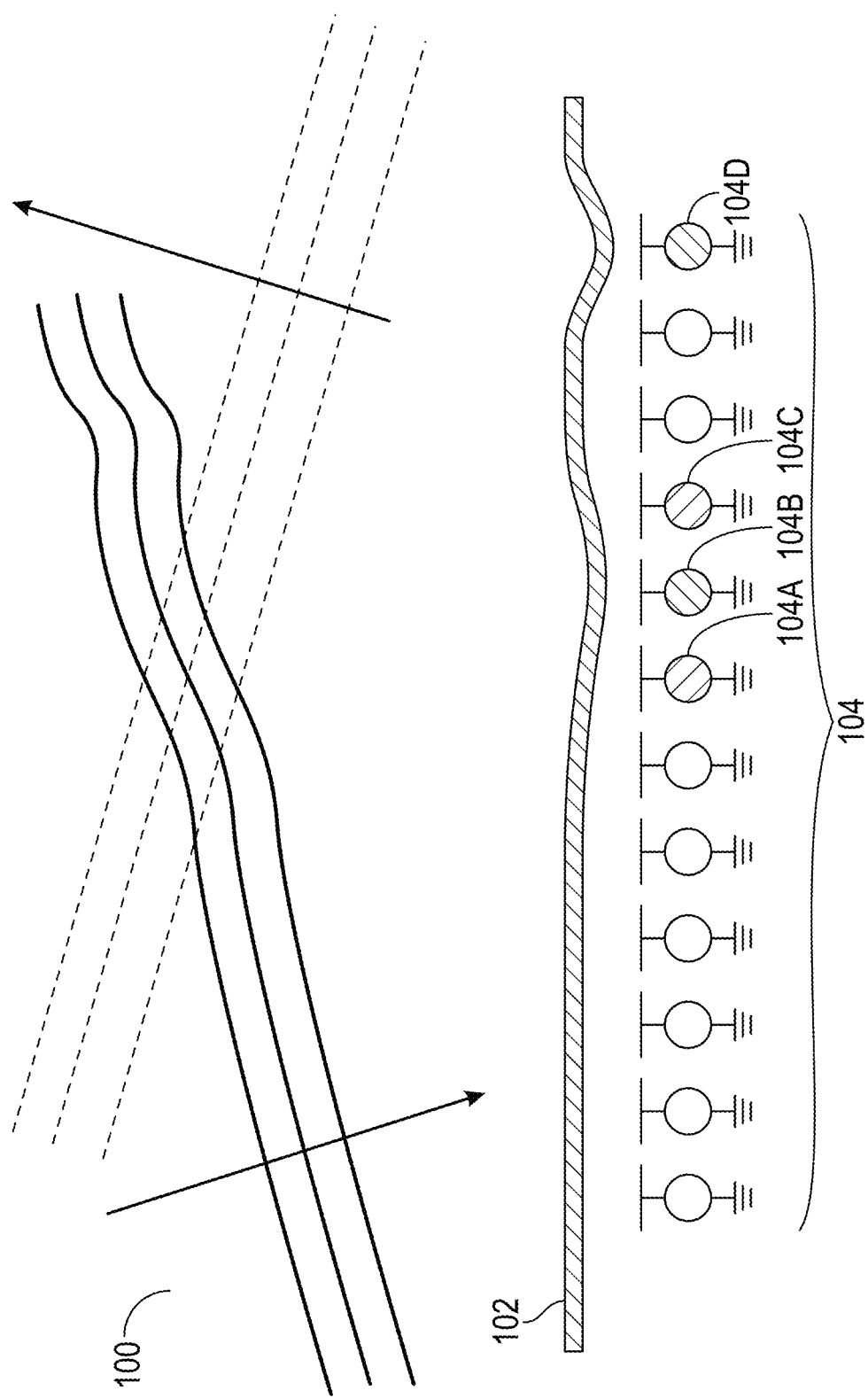

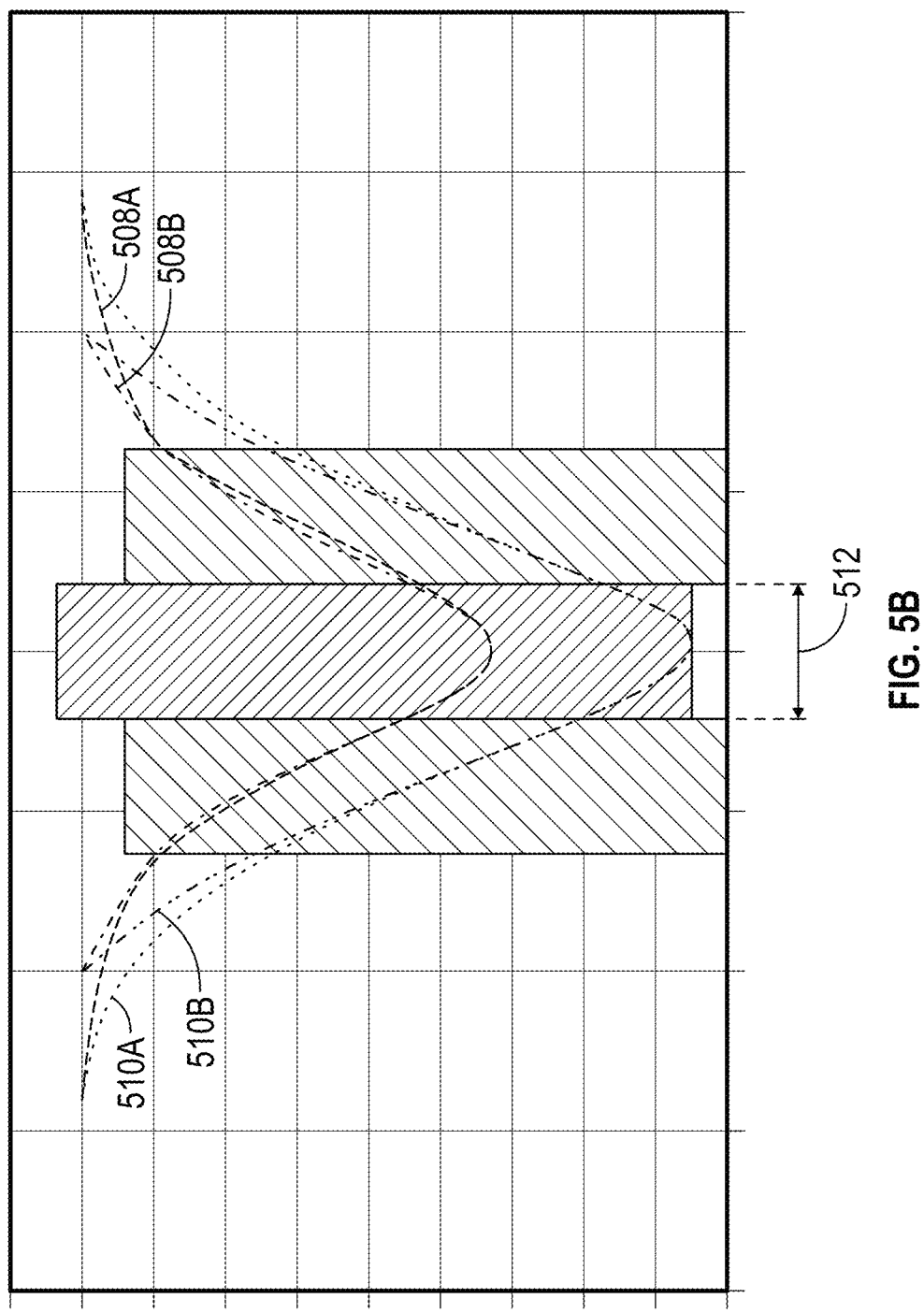

CHARGE TRANSFER CIRCUITRY FOR MEMS DEVICES

CROSS-REFERENCE TO RELATED APPLICATIONS

This application claims benefit of U.S. Provisional Application No. 63/237,496, filed Aug. 26, 2021, the entire disclosure of which is herein incorporated by reference for all purposes.

ACKNOWLEDGEMENT OF GOVERNMENT SUPPORT

This invention was made in part with government support under Contract #80NSSC20C0498 awarded by NASA. The government may have certain rights in the invention.

FIELD OF INVENTION

This disclosure generally relates to microelectromechanical system (MEMS) devices. More specifically, this disclosure relates to electrostatically actuated mirrors constructed using MEMS processes.

BACKGROUND OF THE INVENTION

Deformable mirrors ("DM") include a reflecting surface whose topography can be electronically programmed. DMs are critical in a wide variety of optical applications, including space-based telescopes.

Traditionally, the topography of the reflecting surface is controlled by a plurality of electrostrictive or electrostatic actuators. The actuators are then combined with a mirror element to implement a DM function; in space-based telescopes, for example, sensitivity requirements in instruments such as the coronagraph may be sensitive to residual optical aberrations in the telescope mirrors, and the DM may correct for these errors. To reduce the cost of such systems, monolithic DMs have been designed and constructed using MEMS fabrication processes. These processes may include using silicon wafers as large as 200 mm diameter, and large actuating arrays have been created using this approach.

A DM's performance may affect performance of an associated optical system. Such systems may suffer from at least four deficiencies. First, a high voltage may be needed to actuate (e.g., a high voltage needed to actuate a stroke of 1 μm). For example, current devices may need 190V to move the mirror surface 2 μm or 95V/μm. Second, each array element may need be addressed with its own control voltage, making the drive electronics complex and expensive. For example, $N^2$ elements require $N^2$ wires and $N^2$ voltage sources. Third, each actuator is driven in the "voltage" mode, with a potentially short stroke range over which the mirror can be stably controlled. Fourth, the mirror surfaces may exhibit unwanted topography and/or release etch holes, potentially causing problems in high contrast instruments where scattered light needs to be minimized.

SUMMARY OF THE INVENTION

In some embodiments, a MEMS device including a DM is disclosed. In some embodiments, the MEMS device includes a glass substrate; an electrode on the glass substrate; a hinge mechanically coupled to the electrode; a membrane mirror mechanically coupled to the hinge; a TFT on the glass substrate and electrically coupled to the electrode; and a control circuit comprising: a multiplexer configured to turn on or turn off the TFT; and a drive source configured to provide a drive signal for charging the electrode through the TFT. An amplitude of the drive signal corresponds to an amount of charge, and the amount of charge generates an electrostatic force for actuating the hinge and a portion of the membrane mirror mechanically coupled to the hinge.

In some embodiments, a method of operating a MEMS device includes: measuring, through a glass substrate and an electrode, a gap between the electrode and a portion of a membrane mirror; determining, based on the measured gap, an amount of charge for generating an electrostatic force for actuating the portion of the membrane mirror; driving the electrode with a drive signal having an amplitude to charge the electrode to the amount of charge; generating, with the amount of charge, the electrostatic force; and actuating, using the electrostatic force, the portion of the membrane mirror.

In some embodiments, a method of manufacturing a MEMS device, includes: providing a glass substrate; depositing an electrode on the glass substrate; depositing a first sacrificial layer; forming a hinge, wherein the hinge is mechanically coupled to the electrode; depositing a second sacrificial layer; depositing a membrane mirror above the second sacrificial layer, wherein the membrane mirror is mechanically coupled to the hinge; and releasing the first and second sacrificial layers.

In some embodiments, a MEMS device includes: a glass substrate; an electrode on the glass substrate; a hinge mechanically coupled to the electrode; a membrane mirror mechanically coupled to the hinge; a TFT on the glass substrate and electrically coupled to the electrode; an opening in the glass substrate, in the membrane mirror, or in both; and a control circuit comprising: a multiplexer configured to turn on or turn off the TFT; and a drive source configured to provide a drive signal for charging the electrode through the TFT, wherein: an amplitude of the drive signal corresponds to an amount of charge, and the amount of charge generates an electrostatic force for actuating the hinge and a portion of the membrane mirror mechanically coupled to the hinge.

In some embodiments, a method of manufacturing a MEMS device includes: providing a glass substrate; depositing an electrode on the glass substrate; depositing a first sacrificial layer; forming a hinge, wherein the hinge is mechanically coupled to the electrode; depositing a second sacrificial layer; depositing a membrane mirror above the second sacrificial layer, wherein the membrane mirror is mechanically coupled to the hinge; releasing the first and second sacrificial layers; and creating openings in the glass substrate, in the membrane mirror, or in both, wherein releasing the first and second sacrificial layers comprises releasing the first and second sacrificial layers through the openings.

In some embodiments, a MEMS device includes: a pixel comprising a gap and configured to store an amount of charge, wherein the amount of charge generates an electrostatic force corresponding to a distance of the gap; a pixel switch electrically coupled to the electrode; and an intermediate capacitor electrically coupled to the pixel switch.

In some embodiments, a method of operating a MEMS device includes: setting a voltage of an intermediate capacitor; and electrically coupling the intermediate capacitor to a pixel at a first gap, wherein: the voltage and electrical coupling cause a charge transfer between the intermediate capacitor and the pixel, and the charge transfer causes a change in an electrostatic force of the pixel and the pixel to change from the first gap to a second gap.

BRIEF DESCRIPTION OF THE DRAWINGS

FIGS. 1A and 1B illustrate an exemplary MEMS device, according to embodiments of the disclosure.

FIG. 5B illustrates exemplary displacement of an exemplary MEMS device, according to embodiments of the disclosure.

DETAILED DESCRIPTION OF EXEMPLARY EMBODIMENTS

In the following description of embodiments, reference is made to the accompanying drawings which form a part hereof, and in which it is shown by way of illustration specific embodiments which can be practiced. It is to be understood that other embodiments can be used and structural changes can be made without departing from the scope of the disclosed embodiments.

FIG. 1A illustrates an exemplary MEMS device 100, according to embodiments of the disclosure. In some embodiments, the MEMS device 100 is a DM device. In some embodiments, the MEMS device 100 includes a membrane mirror 102. In some embodiments, N×N actuators 104 (including actuators 104A-104D) are located beneath the membrane mirror 102.

In some embodiments, N is 100, 64, 48, or 32. In some embodiments, N is more than 100, up to 2000. In some embodiments, the MEMS device includes a rectangular actuator array grid with an actuator pitch of 50 µm to 500 µm. Although a row of actuators having a specific arrangement are shown, it is understood that the MEMS device 100 includes actuators spanning a plane parallel to the mirror surface (e.g., N×N actuators are equally spaced beneath the mirror surface), and that the MEMS device 100 may include different actuator arrangements.

In some embodiments, a topography of the membrane mirror 102 is controlled by positions (e.g., height) of the actuators 104 (e.g., to achieve desired optical properties). For example, actuators 104B and 104D are at a short height (e.g., corresponding to a first control signal level), actuator 104A and 104C are at a middle height (e.g., corresponding to a second control signal level), and the rest of the actuators are at a tall height (e.g., corresponding to a third control signal level), forming the illustrated membrane mirror topography. For example, a charge level associated with the third control signal level is higher than a charge level associated with a first control signal level (e.g., more charge reduces a mirror gap more). In some embodiments, the DM update rate is 1 to 100 Hz (e.g., a rate of change of the DM topography (e.g., by changing actuator heights)).

In some embodiments, the actuators 104 are pixel actuators, as described in more detail herein. In some embodiments, as described in more detail herein, the height of the pixel actuator is electronically programmable, and the disclosed MEMS devices and methods of operating the MEMS devices advantageously allow the pixel actuators to be configured for longer stroke range (e.g., a range of programmable heights for an actuator) (e.g., three times the stroke range of present DMs) over which the mirror can be stably controlled, compared to existing DM actuators. In some embodiments, an actuator of the actuators 104 is configured for 1 µm stroke range.

Figure 1B:
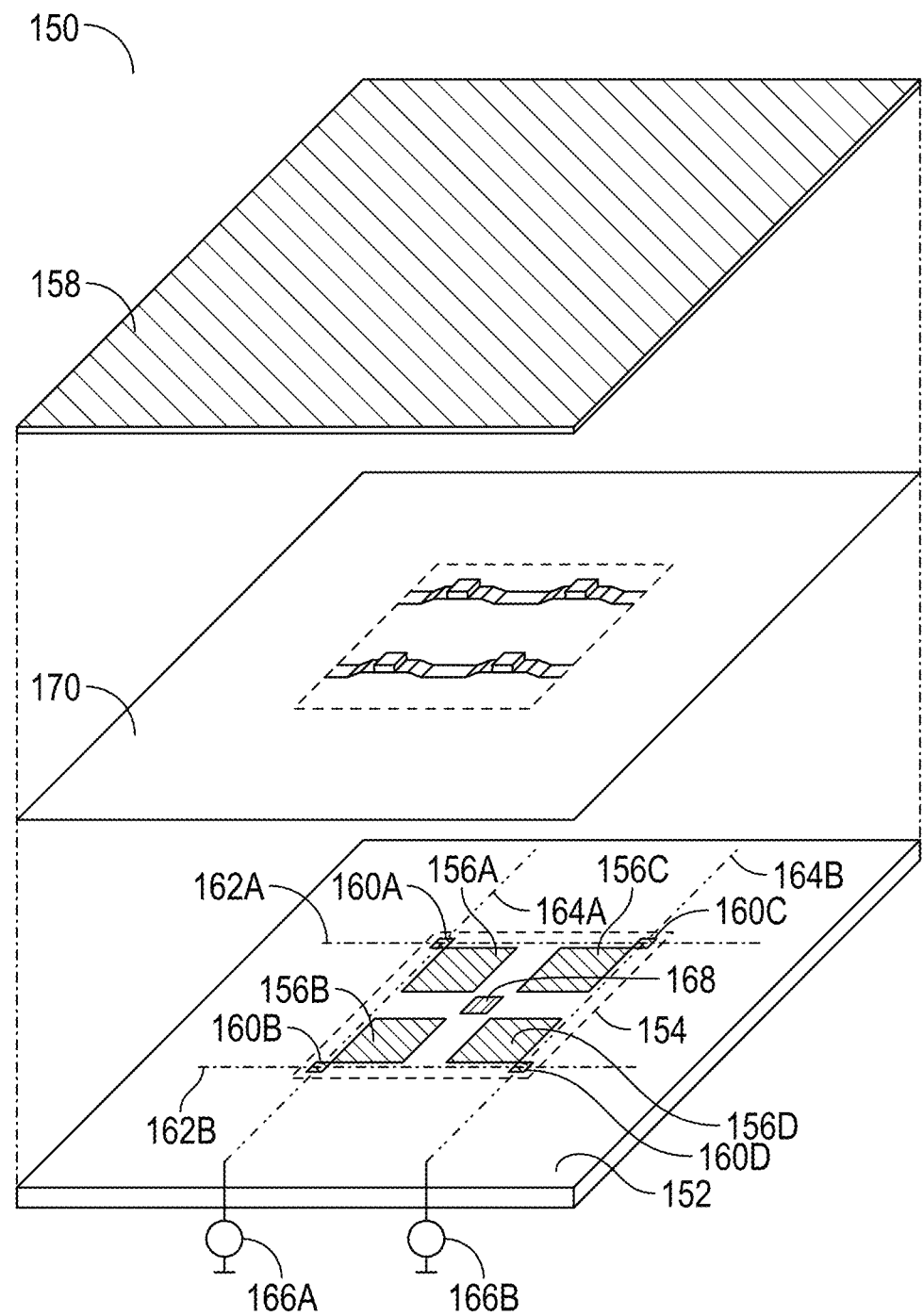

FIG. 1B illustrates an exemplary MEMS device 150, according to embodiments of the disclosure. In some embodiments, the MEMS device 150 is a DM device. In some embodiments, the MEMS device 150 is the MEMS device 100. Although a two-by-two array of DM pixels (e.g., pixels 156A-156D) is illustrated, it is understood that the MEMS device 150 includes a suitable number of DM pixels to control a topography of a membrane mirror to meet system requirements. For example, the MEMS device 150 includes an N×N array of DM pixels (e.g., pixels 156A-156D).

In some embodiments, the MEMS device 150 includes a glass substrate 152. In some embodiments, a substrate of a disclosed MEMS device is a transparent substrate. In some embodiments, components of the MEMS device 150 are fabricated on the glass substrate 152. In some embodiments, the glass substrate 152 is fabricated using flat panel manufacturing processes with low temperature polysilicon thin film transistor (LTPS TFT) capability. By fabricating the disclosed MEMS devices on a glass substrate (e.g., a substrate that is at least 15 times larger than a 200 mm silicon wafer) and leveraging lower cost manufacturing processes (e.g., compared to fabricating a device on a silicon wafer), larger and/or lower cost DMs may be possible. In some embodiments, disclosed MEMS devices reduce device cost by orders of magnitude. The larger and/or lower cost DMs may allow industries such as ophthalmology, industrial lasers, and advanced node lithography (e.g., EUV) to consider the disclosed DMs for optical solutions, which may be possible for present hand assembled or non-multiplexed (e.g., which may not be scalable and/or economical) DMs. In some embodiments, the LTPS TFT MEMS device may be more suitable than silicon-based MEMS devices for applications where radiation hardening is required.

In some embodiments, the disclosed DM is used in space-based telescopes. In some embodiments, the disclosed DM is a device that can present a highly precise reflecting surface across an aperture, and the topography of the reflecting surface can be electronically programmed. In some embodiments, the programmed topography is used to compensate for certain optical imperfections in an imaging instrument.

In some embodiments, the illustrated two-by-two array is a unit cell 154 of an actuator array. For example, if the MEMS device 150 includes an N×N array of DM pixels, the MEMS device includes N/2×N/2 unit cells 154. In some embodiments, the unit cell 154 includes two-by-two pixels 156A-156D. In some embodiments, the pixels 156A-156D are transparent (e.g., in the visible spectrum, in a particular spectrum) electrodes (e.g., indium tin oxide (ITO) electrodes, fluorine-doped tin oxide (FTO) electrodes, a ZnO electrode such as aluminum-doped zinc oxide (AZO) electrodes, indium-doped zinc oxide (IZO) electrodes, $SnO_2$ electrodes, $In_2O_3$ electrodes, Ag nanowire electrodes). In some embodiments, the pixels 156A-156D are not transparent electrodes. In some embodiments, the pixels 156A-156D are configured to allow radiation for measuring a gap (e.g., a laser) between the pixel and the membrane mirror to pass. In some embodiments, the pixels are 50 μm to 500 μm apart. As described in more detail herein, the transparent electrode, in concert with the transparent glass substrate, may advantageously allow for laser probing from a backside (e.g., from a side of the glass substrate opposite to the pixels) to measure or estimate an actuation gap associated with the membrane mirror topography. By being able to measure or estimate an actuation gap, an amount of desired charge to actuate the DM can be computed, and the advantages associated with charge based actuation, as described herein, may be possible.

In some embodiments, each of pixels 156A-156D corresponds to an actuator (e.g., actuators 104) for controlling a topography if the membrane mirror 158 (e.g., membrane mirror 102). For example, each pixel is an active electrode that imparts an electrostatic force (e.g., electrostatic actuation) on a portion (e.g., a 400 μm by 400 μm portion, a 300 μm by 300 μm portion, a portion defined by a pixel pitch) of the membrane mirror 158 above the pixel.

In some embodiments, the membrane mirror 158 includes openings (e.g., holes) (not shown) having a total area of less than 50 $μm^2$ per pixel. In some embodiments, a disclosed opening or hole is a region in a glass substrate or a membrane mirror that does not include the glass substrate or the membrane mirror, but is surrounded by the glass substrate or the membrane mirror.

In some embodiments, the openings of the membrane mirror are configured as release holes for the MEMS device. These holes advantageously may allow the MEMS device to be released from the mirror side, instead of the glass substrate side, which allow the glass substrate to be flattened to meet substrate flatness requirements (e.g., allows a glass substrate having tens of microns of bowing to be flattened to a suitable flatness for the DM). In some embodiments, each of these holes have less than a 10 μm diameter (e.g., 6 μm), to reduce cracking while the membrane mirror is planarized and/or minimize print-through, as described with respect to FIGS. 4A-4G. In some embodiments, the holes of the membrane mirror advantageously yield a continuous reflecting surface (e.g., with no large release etch hole structures, which cause unwanted light scattering, present in existing MEMS-based systems) while allowing the advantages described above.

In some embodiments, a thin film transistor (TFT) (e.g., TFTs 160A-160D) is electrically coupled to each pixel (e.g., TFT 160A is electrically coupled to 156A, TFT 160B is electrically coupled to 156B, TFT 160C is electrically coupled to 156C, TFT 160D is electrically coupled to 156D). In some embodiments, the TFTs 160A-160D are LTPS TFTs. In some embodiments, when the TFT is conducting (e.g., "on"), it is configured allow charge to be transferred to a corresponding electrode (e.g., provided by a corresponding drive signal (e.g., from column lines 164A and 164B) to actuate a corresponding electrostatic actuator), and when the TFT is not conducting (e.g., "off"), it is configured to electrically isolate the corresponding electrode from a corresponding drive signal.

In some embodiments, row lines 162A and 162B are coupled to a first row of TFTs (e.g., gates of TFTs 160A and 160C) and a second row of TFTs (e.g., gates of TFTs 160B and 160D), respectively. The signals on the row lines are configured to turn a corresponding row of TFTs on or off (e.g., to allow charge to be transferred to a corresponding row of electrode or to electrically isolate the corresponding row electrode from corresponding drive signals).

In some embodiments, column lines 164A and 164B are coupled to a first column of TFTs (e.g., sources or drains of TFTs 160A and 160B) and a second column of TFTs (e.g., sources or drains of TFTs 160C and 160D), respectively. The drive signals on the column lines are configured to control an actuation level of a corresponding electrostatic actuator. For example, the drive signal allows charge to be transferred to a corresponding electrode, and an amount of charge transferred to the corresponding electrode (e.g., an actuator control signal) cause a level of electrostatic actuator actuation (e.g., a level of actuation of a corresponding portion of the membrane mirror 158).

In some embodiments, the drive signals are provided by drive sources. For example, drive source 166A provides the drive signal for column line 164A, and drive source 166B provides the drive signal for column line 164B. In some embodiments, a drive source is configured to provide a voltage or a current for charging a corresponding electrode (e.g., to generate an actuator control signal). In some embodiments, the drive sources are located off the glass substrate 152. In some embodiments, the drive sources are located on the glass substrate 152.

In some embodiments, the MEMS device 150 includes an opening 168 (e.g., a hole). For example, each unit cell of the MEMS device 150 includes an opening 168. In some embodiments, the opening 168 is a hole in the glass substrate 152 (e.g., a MEMS release etch hole) that allows sacrificial material above the glass substrate 152 to be etched from below (e.g., with a suitable gas phase etchant). In some embodiments, in lieu of the opening 168 or in addition to the opening 168, the membrane mirror 158 includes openings (not shown) (e.g., openings or holes having a total area of less than 50 $μm^2$ per pixel (e.g., to meet a light scattering requirement for the mirror)) to release sacrificial material. In some instances, the opening 168 allows the top surface of the membrane mirror 158 to be continuous (e.g., the membrane mirror 158 includes openings (e.g., holes for device release) having a total area of less than 50 $μm^2$ per pixel, the membrane mirror 158 does not include opening), advantageously reducing unwanted light scattering that may be present in existing DMs. In some embodiments, the opening 168 is created by drilling (e.g., using a laser) the opening into the glass substrate 152 or by patterning lithographically, to provide release etchants to enter and escape the MEMS device. In some embodiments, the etching is performed by lithography and etch processes (e.g., with a hard mask).

In some embodiments, the membrane mirror is continuous if the continuous mirror (e.g., having total mirror hole or opening areas of less than 50 $μm^2$ per pixel) geometry minimizes unwanted light scattering to meet DM specifications (e.g., 0.5% scattering of incoming radiation for a 100 μm by 100 μm pixel, requirements for a scatter sensitive instrument such as coronagraphs).

In some embodiments, the MEMS device 150 includes a MEMS hinge layer 170. In some embodiments, the MEMS hinge layer 170 includes a hinge mechanically coupled to a pixel or an electrode (e.g., a pixel of pixels 156A-156D) and a corresponding portion of the membrane mirror 158 (e.g., the hinge and the electrode do not necessarily overlap). In some examples, a first component is mechanically coupled to a second component when the first component is actuated, the second component is moved in response to the actuation. For example, when an electrode is being actuated, a hinge mechanically coupled to the electrode moves in response to the actuation, and a corresponding portion of the membrane mirror is moved in response to the hinge moving (e.g., through a disclosed center post, through a direct mechanical connection between the hinge and the membrane mirror).

In some embodiments, the MEMS hinge layer 170 is configured to support the membrane mirror 158 and provide a restoring force that counterbalances an attractive electrostatic force between an electrode and a metal plane (e.g., a metal plane above the electrode). In some embodiments, the MEMS hinge layer 170 is fabricated using a MEMS process (e.g., deposition, photolithography, etch, and release; a MEMS process referenced herein) with the hinge embedded in a suitable sacrificial material that can be etched away, leaving behind a released hinge structure.

In some embodiments, the disclosed MEMS device is implemented using manufacturing technologies described in PCT Publication PCT/US2019/022338 (IMG), the entire disclosure of which is herein incorporated by reference for all purposes. IMG allows for the integration of thin film transistor circuits and MEMS device features on a common glass substrate. In some embodiments, a hinge (e.g., of the MEMS hinge layer 170) disclosed herein is manufactured using the manufacturing technologies described in PCT Publication PCT/US2019/022338.

In some embodiments, membrane mirror 158 is located above the MEMS hinge layer 170 (e.g., opposite from a direction from the hinge layer to the substrate). In some embodiments, the membrane mirror 158 is sufficiently thick (e.g., to reduce print-through of structures below the mirror). For example, the membrane mirror 158 is 1 µm thick. In some embodiment, the top surface of the membrane mirror 158 material is a reflective metal surface (e.g., aluminum, silver). In some embodiments, the metal surface is dielectrically passivated to protect the surface and enhance reflectivity. In some embodiments, the top surface of the membrane mirror 158 is continuous (e.g., the membrane mirror 158 includes openings (e.g., holes for device release) having a total area of less than 50 µm$^2$ per pixel, the membrane mirror 158 does not include opening) with release etch holes (e.g., openings 168, openings on the membrane mirror 158) provided, advantageously reducing unwanted light scattering that may be present in existing DMs.

In some embodiments, the membrane mirror 158 includes a dielectric center sandwiched by metal layers. In some embodiments, a top or a bottom metal layer of the membrane mirror 158 forms an interferometric cavity with a pixel, to allow optical readout of a gap between the bottom metal layer and the pixel, as described in more detail herein. In some embodiments, a top metal layer of the membrane mirror is a reflective material, as described herein, to support high efficiency and system power handling requirements.

In some embodiments, the hinges of the MEMS hinge layer 170 include restoring springs (not shown). A suitable amount of restoring springs may be included at appropriate locations of a disclosed MEMS device. For example, if restoring springs are included at intermediate locations (e.g., a spring having a different stiffness as a main spring, a spring having a same stiffness as a main spring) between electrodes and at electrode pitches, a full width half maximum (FWHM) of a corresponding influence function (e.g., displacement of a corresponding portion of the membrane mirror) for an actuated electrode is at a narrower width (e.g., 300 µm), allowing finer control of mirror topography. As another example, if restoring springs are included at electrode pitches, FWHM of a corresponding influence function for an actuated electrode is at a wider width (e.g., 430 µm). In some embodiments, edges of an influence function of an electrode are affected by springs of neighboring electrodes (e.g., for a rectangular electrode arrangement, a profile along a diagonal would be different compare a profile along an axis; for a hexagonal electrode arrangement, profile along different axis of the hexagon would be more uniform).

In some embodiments, the disclosed DMs meet the following requirements: for a 64×64 actuator array and a 300 µm to 400 µm actuator pitch, a 6 nm RMS flattened surface is achieved. For a 32×32 actuator array, a 3 nm RMS flattened surface and a $8.5 \times 10^{-9}$ coherent contrast at 10% bandwidth are achieved. For a 48×48 actuator array, less than $1 \times 10^{-8}$ contrast is achieved. Contrast drifts of $1 \times 10^{-12}$ over 4 hours and $1 \times 10^{-8}$ over 42 hours are achieved. The drive electronics for the DM provide 16 bits or higher resolution, contributing to a $1 \times 10^{-1}$ contrast floor. In some embodiments, the disclosed DMs can achieve a stroke range of 1 µm with a resolution of 10 picometers (e.g., using the optical estimation/measurement methods disclosed herein). In some embodiments, actuators of the disclosed DMs are configured for a longer stroke range (e.g., three times the stroke range of present DMs) over which the mirror can be stably controlled.

Figure 2:
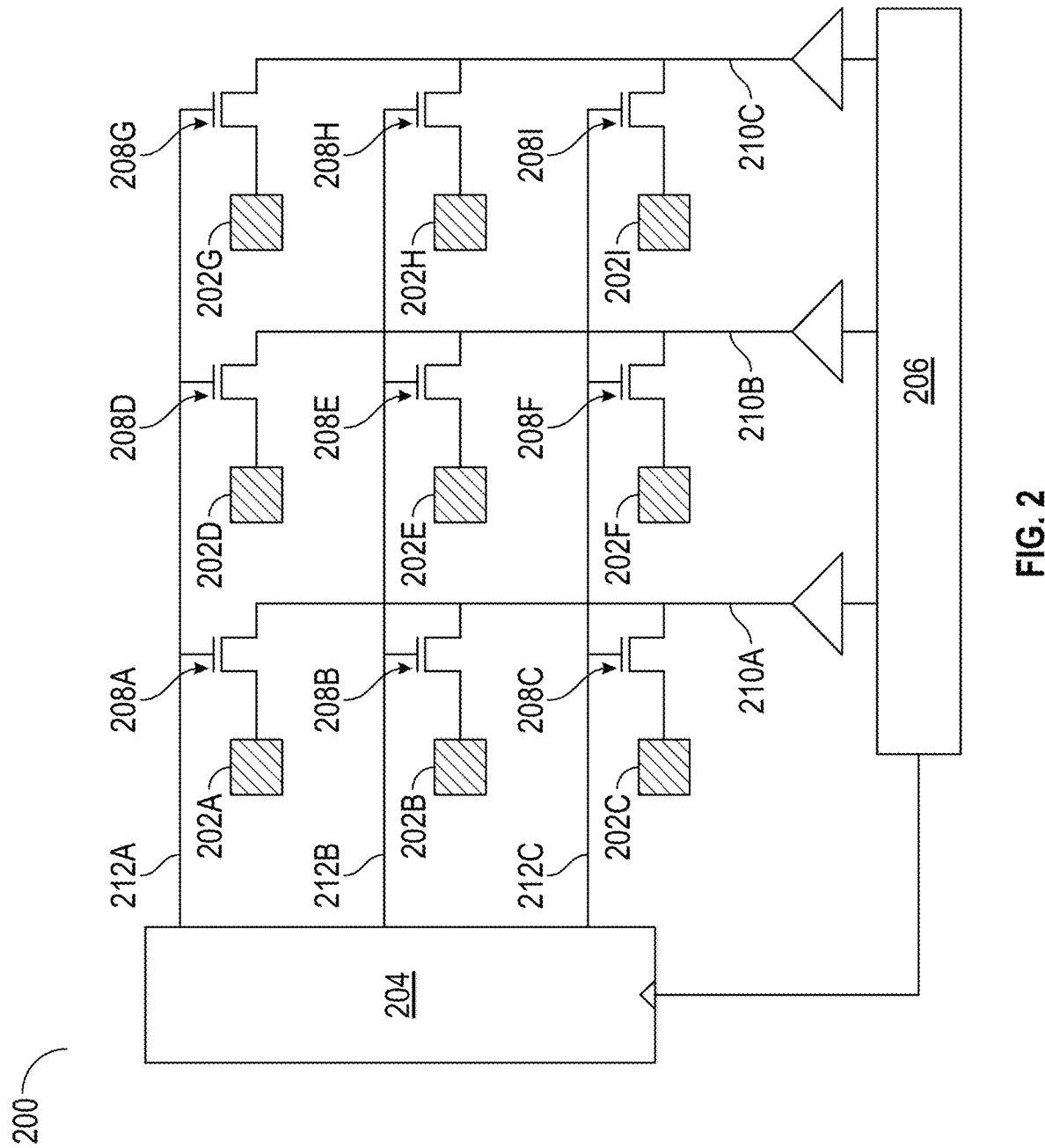
FIG. 2 illustrates an exemplary MEMS device circuit, according to embodiments of the disclosure.

FIG. 2 illustrates an exemplary MEMS device circuit 200, according to embodiments of the disclosure. In some embodiments, the MEMS device circuit 200 is part of a disclosed MEMS device. In some embodiments, the MEMS device circuit 200 is an addressing circuit for controlling electrodes (e.g., pixels 156A-156D) for DM actuation. In some embodiments, the MEMS device circuit 200 implements a LTPS TFT addressing mechanism for row-scanning the electrodes. The MEMS device circuit 200 advantageously reduces the complexity of the DM by reducing a number of required signals for controlling the electrostatic actuator array. For example, for a N×N array, using the disclosed pixel control multiplexing, the MEMS device circuit 200 reduce a number of required signals for controlling the array to N, compared to $N^2$ in present DMs.

In some embodiments, the MEMS device circuit 200 includes pixels 202A-202I, multiplexer 204, array driver 206, and transistors 208A-208I. For example, pixels 202A-202I include the pixels 156A-156D, and transistors 208A-208I include TFTs 160A-160D. In some embodiments, the multiplexer 204 includes a shift register circuit that provides row multiplexing signal to select (e.g., by providing a suitable gate voltage) one row (e.g., rows 212A-212C, which may include rows 162A and 162B) after another in a sequence (e.g., and repeats after all the rows of an array have been selected). In some embodiments, a frequency of the row scanning is 1 to 100 Hz.

In some embodiments, the array driver 206 provides drive signals for columns of the MEMS device circuit 200. For example, the columns 210A-210C includes column lines 164A and 164B, and the array driver 206 includes drive source 166A providing a drive signal for column line 164A (e.g., to charge a coupled electrode to achieve a desired electrostatic force on a corresponding portion of the membrane mirror (e.g., membrane mirror 158)) and drive source 166B providing a drive signal for column line 164B (e.g., to charge a coupled electrode to achieve a desired electrostatic force on a corresponding portion of the membrane mirror (e.g., membrane mirror 158)). In some embodiments, the array driver 206 is a part of a drive ASIC (e.g., a LCD column driver ASIC).

In some embodiments, the membrane mirror (e.g., membrane mirror 158) is considered to be a ground plane. For example, a bottom surface of the membrane mirror (e.g., a surface of the membrane mirror 158 facing the electrodes, a conductive bottom mirror layer of the membrane layer, a conductive top mirror layer of the membrane layer) is the ground plane. In some embodiments, if a capacitance between an electrode and the mirror ground plane is known, then a drive signal (e.g., a voltage, a current) applied to a column line can inject a desired amount of charge to create a desired electrostatic force for a particular electrode (and corresponding electrostatic actuator).

In some embodiments, the drive signal is a short voltage pulse of amplitude V (e.g., less than 20V), and after the drive signal is applied to the column line and a corresponding electrode, then a corresponding TFT is turned off (e.g., by multiplexer 204) to maintain the charge and electrostatic force between the electrode and the mirror ground plane. In some embodiments, the amplitude V is less than voltages needed to actuate electrostatic actuators in voltage-controlled DMs, and thus, using the disclosed charge-controlled actuation advantageously saves power, compared to voltage-controlled DMs. For example, in some embodiments, low voltage (e.g., less than 10V) actuation is advantageously provided by the disclosed charge-controlled pixel actuation.

For example, if the capacitance between the electrode and the mirror ground plane prior to actuation is C and the duration of the drive signal (e.g., pulse width) (e.g., less than 10 ρs) is much shorter than mechanical response time of the mirror, then the charge injected into the electrode is given by Q=CV. In some embodiments, C is estimated or computed by measuring a corresponding position of the membrane mirror with respect to the glass substrate (e.g., glass substrate 152).

In some embodiments, the electrode and the glass substrate are transparent, and a laser beam incident from the substrate reflecting off the membrane mirror ground plane is used to perform measurement with an interferometer. In some examples, a fractional error in a capacitance measurement is equal to a fractional error in this measurement; if there is an upper bound of 1 nm error associated with the laser measurement, then a low uncertainty of 1/1000 and 2 nm in actuation distance advantageously result, at a quiescent distance of 1 µm between the electrode and the mirror ground plane.

As an exemplary advantage, using charge as the electrostatic actuation control signal for electrostatic actuation, as described herein, may be more stable and yield a longer stroke range than performing electrostatic actuation using voltage because an actuation distance as a function of charge is monotonic (e.g., it is not monotonic as a function of voltage), and superposition of electrostatic forces may apply. In some embodiments, force, mirror gap, and charge are expressed as $$F = \frac{Q^2}{2\epsilon_0 A} = -k(x - x_0),$$

so the actuation distance as a function of charge is expressed as $$x = -\frac{Q^2}{2\epsilon_0 Ak} + x_0,$$

where $x_0$ is an initial gap of a corresponding portion of the membrane mirror. The transparent electrode and glass substrate of the disclosed MEMS devices advantageously allow the actuation distance to be measured or estimated (e.g., using a laser) accurately, as explained above, and thus, the capacitance between an electrode and the mirror ground plane can be computed. By computing the capacitance between the electrode and the mirror ground plane, a desired amount of charge and drive signal parameters (e.g., amplitude, pulse width) to achieve the desired amount of charge may be computed—allowing charge to be used as the electrostatic actuation control signal for improved accuracy, improved stability, improved topography smoothness (e.g., due to linearity of charge-controlled actuation), and/or longer stroke range (e.g., three times the stroke range, compared to using voltage) above using voltage.

As an example, at a first time, a first row of rows 212A-212C is selected by the multiplexer 204 by turning on the transistors of the first row. After the transistors of the first row are turned on, the array driver 206 provides drive signals to the columns of the MEMS device circuit 200. In some embodiments, the array driver 206 is located off the glass substrate (e.g., glass substrate 152). In some embodiments, the array driver 206 is located on the glass substrate (e.g., glass substrate 152). In some embodiments, a drive signal for a column is a signal (e.g., a voltage, a current) needed to charge a corresponding electrode on the selected row and the column (e.g., coupled by a corresponding transistor) to achieve an electrostatic force needed to actuate a corresponding electrostatic actuator.

In this example, at a second time, after electrodes of the first selected row are charged to a desired value (e.g., after the drive signals are applied to electrodes of the first row), a second row of rows 212A-212C, different from the first selected row, is selected by the multiplexer 204 by turning on the transistors of the second row. After the transistors of the second row is turned on, the array driver 206 provides drive signals to the columns of the MEMS device circuit 200.

In some embodiments, all the rows of electrodes are charged in this manner and a desired membrane mirror topography is achieved. In some embodiments, after a first desired membrane mirror topography is achieved, a second desired membrane mirror topography is programmed by driving the electrodes in a similar manner with appropriate drive signal values to achieve desired electrostatic forces corresponding to the second desired topography.

Figure 3A:
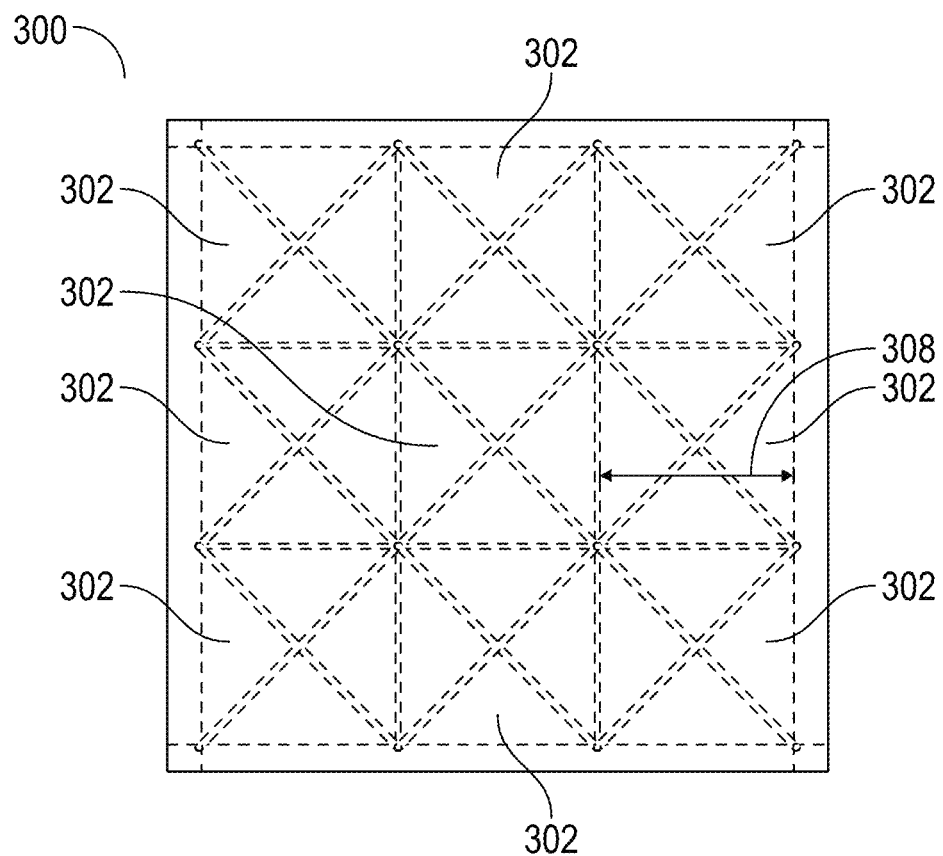
FIGS. 3A and 3B illustrate an exemplary MEMS device, according to embodiments of the disclosure.
Figure 3B:
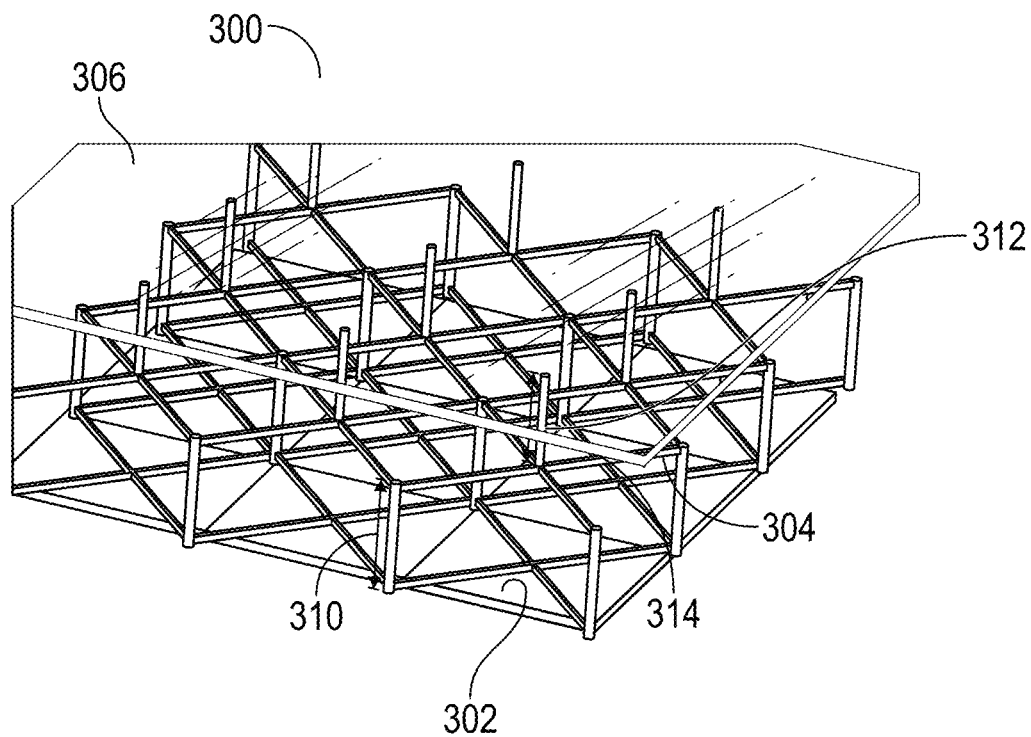

FIGS. 3A and 3B illustrate an exemplary MEMS device 300, according to embodiments of the disclosure. In some embodiments, the MEMS device 300 includes electrodes 302, mechanical hinges 304, and membrane mirror 306. In some embodiments, the MEMS device 300 is a part of the MEMS device 150. For example, the electrodes 302 include transparent pixels 156A-156D (e.g., transparent ITO electrodes) on a glass substrate, mechanical hinges 304 are part of the MEMS hinge layer 170, and membrane mirror 306 is membrane mirror 158.

In some embodiments, the electrodes 302 have a pitch 308. In some embodiments, the pitch 308 is 50 µm to 500 µm. In some embodiments, as illustrated, the electrodes 302 are segmented into four quadrants. It is understood that the electrode 302 may be segmented differently to achieve desired properties and meet system requirements. It is also understood that the electrode 302 may not be arranged in a rectangular grid. For example, the electrode 302 may be arranged in a hexagonal grid. In some embodiments, the electrodes 302 are segmented as illustrated to reduce tilting a corresponding portion of the membrane mirror (e.g., due to asymmetries of an unsegmented electrode, charge distribution on the unsegmented electrode may not be uniform) by allowing charge distribution the segmented electrode to be more uniform.

In some embodiments, a hinge 304 has a height 310 of 2 μm, and a center post 312 mechanically coupled to a hinge has a height 314 of 2 μm. In some embodiments, the hinges 304 and center posts 312 are aligned along slots between electrode segments to reduce electrical shorting between electrodes and the membrane mirror. In some embodiments, the hinges 304 comprise silicon nitride, which has an intrinsic tensile stress to produce a restoring force, when configured as a pair of crossed fixed-fixed beams, as illustrated.

The ratio of hinge stress to membrane mirror stress/drumhead stress may determine an extent of influence or shape function of the electrostatic actuators (e.g., corresponding to each electrode). For example, an influence function of one electrode is a Gaussian function with its actuated peak (e.g., 1 μm) at a center point of the actuator and edges of the electrode at half the peak value. As another example, an influence function of two neighboring electrostatic actuators has their actuated peak (e.g., 1 μm) from a center point of a first electrode to a center point of a second electrode and is at half the peak value an edge of each of the electrodes. In some embodiments, the hinges are configured to be stronger, to more mechanically isolate between the electrodes and allow for higher spatial frequencies (e.g., topography reference rate). In some embodiments, the hinges are configured to be weaker, to allow for a smoother transition between adjacent portions of a membrane mirror.

In some embodiments, the center post 312 is mechanically coupled between the hinge 314 and the membrane mirror 306. In some embodiments, the center post 312 is constructed in a similar manner as the membrane mirror 306 (e.g., the center post 312 is a same layer as a bottom surface of the membrane mirror 306, as described with respect to FIGS. 4A-4G), to smoothly diffuse the coupling between the center post and the membrane mirror (instead of creating a protrusion).

In some embodiments, the electrodes 302 apply an electrostatic force to corresponding portions of the membrane mirror to achieve a desired topography. For example, segments of an electrode 302 are driven at a same time by a drive signal to inject a same charge to the segments of the electrode and then electrically isolated from the drive signal by a corresponding TFT transistor or switch. When the electrode 302 is electrically isolated from the drive signal, an electrostatic force applied to the membrane mirror 306 is constant and depends on the value of the charge (e.g., the electrostatic actuation control signal) provided by the drive signal.

In some embodiments, the MEMS device 300 includes restoring springs (not shown) (e.g., a set of springs interspersed between main springs (e.g., of the hinge) of the electrodes). A suitable amount of restoring springs may be included at appropriate locations of a disclosed MEMS device. For example, if restoring springs are included at intermediate locations between electrodes 302 and at electrode pitches, a full width half maximum (FWHM) of a corresponding influence function (e.g., displacement of a corresponding portion of the membrane mirror) for an actuated electrode is at a narrower width (e.g., 300 μm), allowing finer control of mirror topography. As another example, if restoring springs are included only at electrode 302 pitches, FWHM of a corresponding influence function for an actuated electrode is at a wider width (e.g., 430 μm). In some embodiments, an attachment pad is coupled between the membrane mirror and a restoring spring. The FWHM may be widened by stiffening the attachment pad.

In some examples, due to influence of forces of neighboring electrodes, the force of the electrode may remain the same, even as a gap between the electrode and the membrane mirror changes. Therefore, in these examples, superposition applies, and in some embodiments, a shape of the membrane mirror controlled by N×N electrodes can be calculated as a linear sum of individual forces, influences, or shape functions from each electrode, which is a simpler calculation compared to voltage-controlled electrostatic actuators, where generated forces are more complex non-linear functions of actuator positions (e.g., functions that include less regions of stability).

FIGS. 4A-4G illustrate an exemplary manufacturing of an exemplary MEMS device 400, according to embodiments of the disclosure. It is understood that a sequence of manufacturing the exemplary MEMS system may not follow the sequence of FIGS. 4A-4G. For brevity, advantages of the MEMS device 400 described with respect to FIGS. 1-3 and 5 are not described again.

Figure 4A:
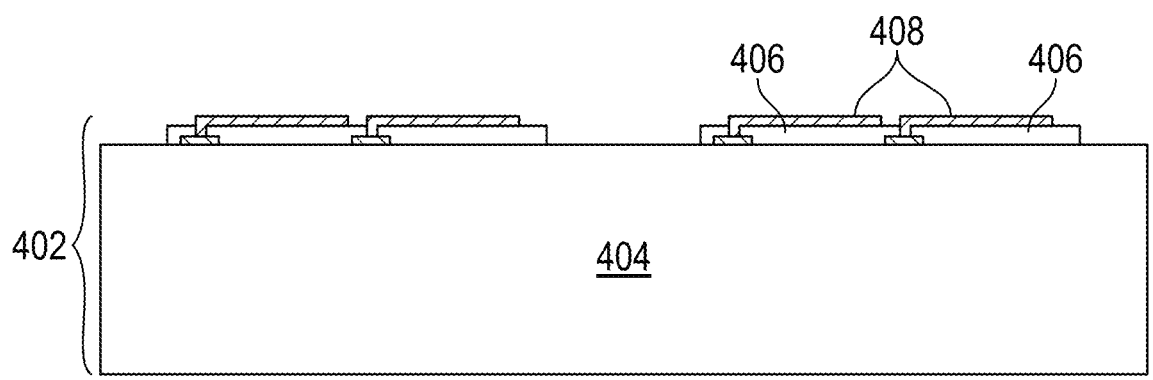
FIGS. 4A-4G illustrate an exemplary manufacturing of an exemplary MEMS device, according to embodiments of the disclosure.

In some embodiments, as illustrated in FIG. 4A, a process of manufacturing an exemplary MEMS device (e.g., a MEMS device disclosed herein) begins with fabrication of a backplane 402 (e.g., LTPS TFT backplane). In some embodiments, the backplane includes a glass substrate 404. For example, the backplane includes TFTs (e.g., electrode or pixel switches), multiplexer (e.g., multiplexer 204), and routing lines for connecting the electrodes or pixels. In some embodiments, the backplane is passivated by a layer of silicon dioxide 406. In some embodiments, transparent electrodes 408 (e.g., disclosed pixels or electrodes) are deposited and connected to the backplane using vias. In some embodiments, the backplane 402 provides interface requirements for the electrodes 408.

Figure 4B:
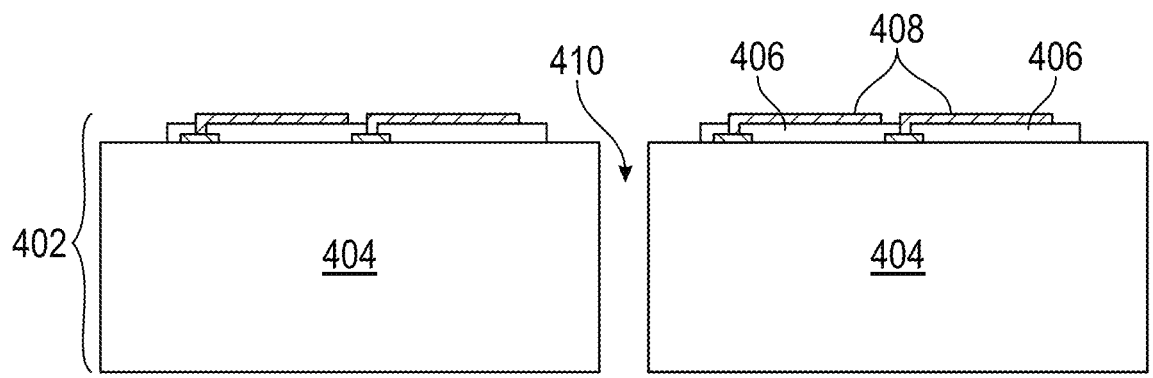

In some embodiments, as illustrated in FIG. 4B, an opening 410 (e.g., hole) is drilled. For example, the opening 410 is opening 168. In some embodiments, the opening 410 is drilled using laser drilling tools or patterned lithographically, to fabricate a high aspect ratio opening in the glass substrate 402. In some embodiments, openings (e.g., holes) are formed in a membrane mirror (such as membrane mirrors 158 and 306 described with respect to FIGS. 1B, 3A, and 3B, and top mirror layer 422 described with respect to FIG. 4G), as described with respect to FIG. 4F, in lieu of the opening 410 or in combination with the opening 410 for ashing the sacrificial material before completing fabrication of the MEMS device.

Figure 4C:
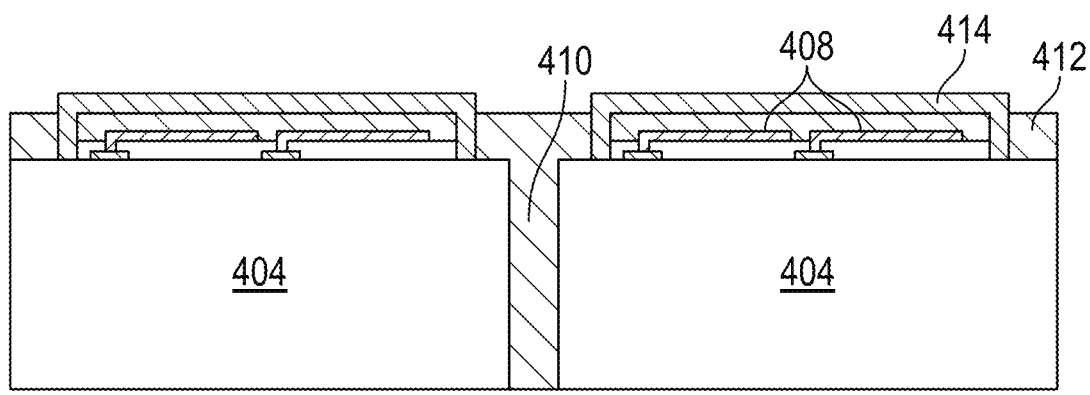

In some embodiments, as illustrated in FIG. 4C, a first sacrificial layer 412 backfilled the opening 410. In some embodiments, the sacrificial layer 412 includes a same sacrificial material used for formation of the MEMS device 400's electromechanical layer (e.g., hinges 414).

In some embodiments, the first sacrificial layer 412 is a 2 μm thick polyimide layer deposited over the electrodes 408. In some embodiments, the hinges 414 are silicon nitride hinges patterned on top of the first sacrificial layer 412 and anchored to the glass substrate 404 using vias. In some embodiments, a thickness of the hinges 414 is 200 nm.

Figure 4D:
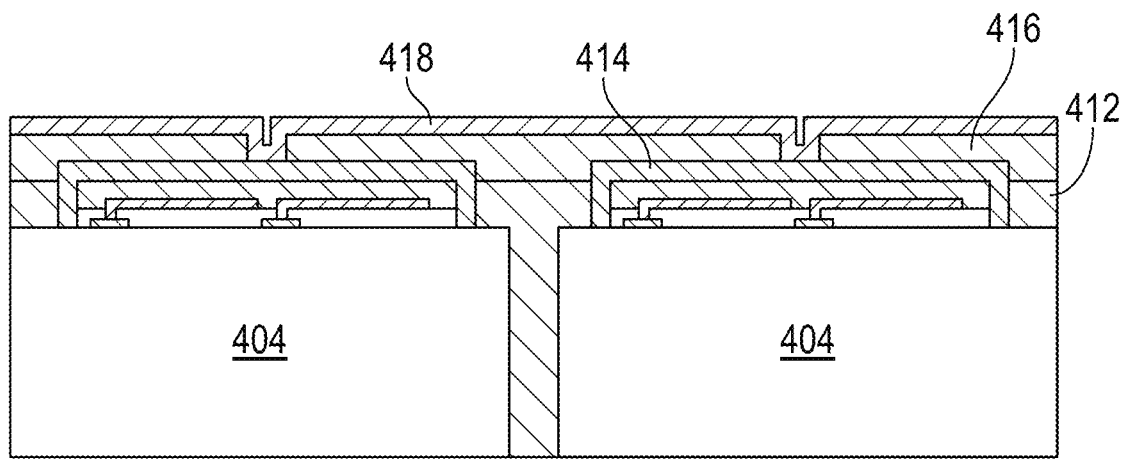

In some embodiments, as illustrated in FIG. 4D, a second sacrificial layer 416 is deposited over the hinges 414. In some embodiments, the second sacrificial layer 416 is a 2 μm thick polyimide layer. In some embodiments, vias for the center posts (e.g., above the hinges 414) are patterned, and a bottom mirror layer 418 is deposited above the second sacrificial layer 416 and into the center post vias. In some embodiments, the bottom mirror layer 418 is a 50 nm thick layer of aluminum sputtered over the second sacrificial layer 416 and into the center post vias.

Figure 4E:
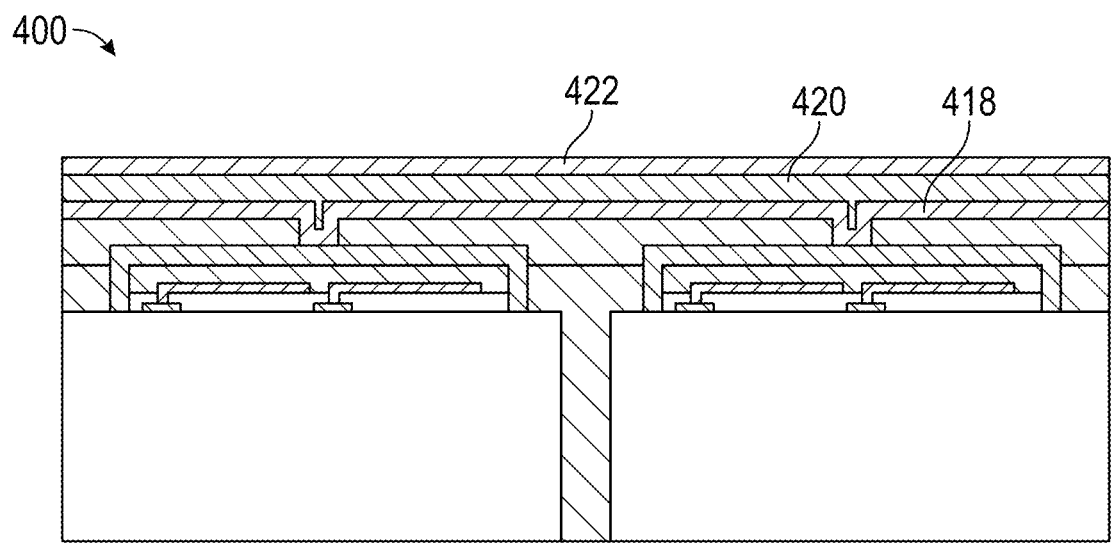

In some embodiments, as illustrated in FIG. 4E, a dielectric layer 420 is deposited over the bottom mirror layer 418. In some embodiments, the dielectric layer 420 comprises a Spin-on-Dielectric (SOD) material (e.g., silicon dioxide particles suspended in a solution, which can be cured to leave behind a flat solid layer, a material having a low viscosity liquid state prior to curing and configured for planarizing) that is sufficiently thick to planarize the mirror topopgraphy (e.g., to create a flat top surface of the membrane mirror). In some embodiments, the dielectric layer 420 includes a series of SOD layers to meet more stringent flatness requirements. In some embodiments, as illustrated, the dicelectric layer 420 fills center post areas of the bottom mirror layer 418. In some embodiments, the dielectric layer 420 is planarized using chemical mechanical polishing (CMP).

In some embodiments, a top mirror layer 422 is deposited above the dielectric layer 420 (e.g., to form a continuous mirror surface). In some embodiments, the top mirror layer 422 is a 50-100 nm thick reflective material (e.g., aluminum) to meet reflectivity and system power handling requirements.

In some embodiments, openings (e.g., etch holes) (not shown) are formed in a membrane mirror (e.g., concentric holes are formed in bottom mirror layer 418, dielectric layer 420, top mirror layer 422), in lieu of the opening 410 or in combination with the opening 410 for ashing the sacrificial material (e.g., from first sacrificial layer 412 and/or second sacrificial layer 416) before completing fabrication of the MEMS device. In some embodiments, the holes have a total area of less than 50 μm² per pixel, and advantageously allow the holes to serve as release holes for MEMS device 400 while minimizing unwanted light scattering to meet DM requirements. In some embodiments, each of these holes have less than a 9 μm diameter (e.g., 6 μm), to reduce cracking while the membrane mirror is planarized and/or minimize print through. In some embodiments, the top mirror layer 422 is planarized to create a flat mirror surface (e.g., to achieve a less than 5 nm RMS roughness).

Figure 4F:
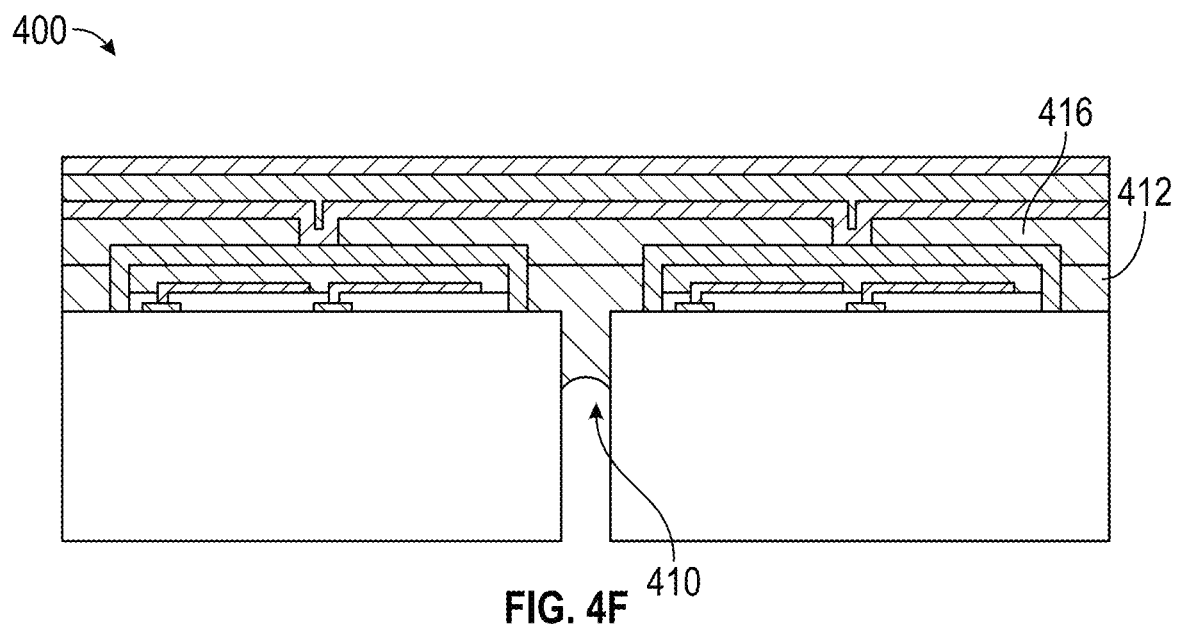

In some embodiments, as illustrated in FIGS. 4F, material of the first and second sacrificial layers 412 and 416 are removed. In some embodiments, the sacrificial layers are removed by oxygen plasma ashing. In some embodiments, if the opening 410 is plugged by a same material as the first or second sacrificial layer, then the material in the opening 410 is removed first, and a channel is formed for the plasma to ash the sacrificial material of the sacrificial layers.

Figure 4G:
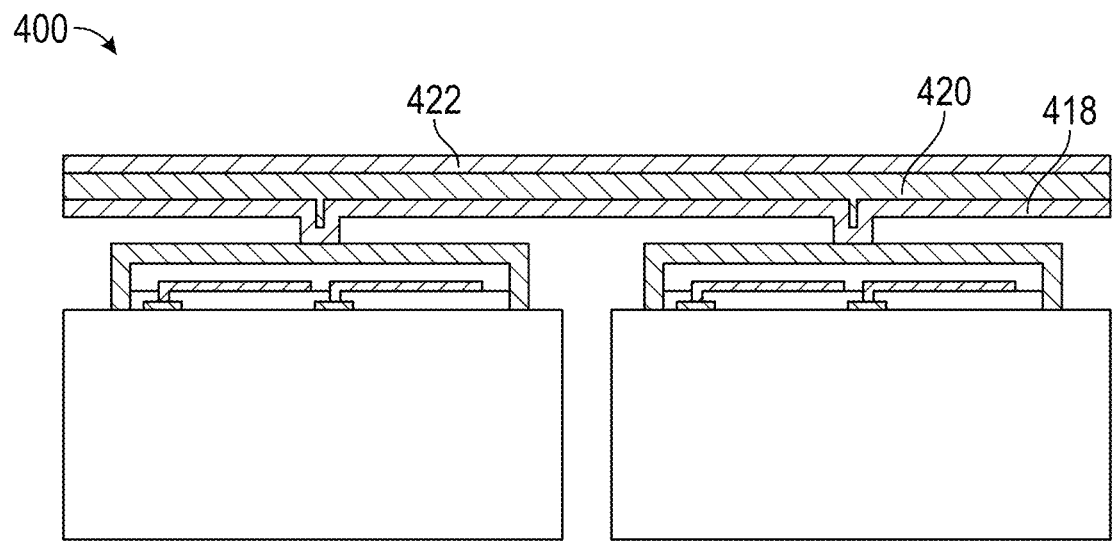

In some embodiments, as illustrated in FIG. 4G, the MEMS device 400 is fabricated using the steps described with respect to FIGS. 4A-4F. In some embodiments, the MEMS device 400 is formed after the sacrificial material is ashed, and the opening 410 is subsequently plugged when the MEMS device 400 is packaged. In some embodiments, a membrane mirror of the MEMS device 400 includes the top mirror layer 422, the dielectric layer 420, and bottom mirror layer 418. In some embodiments, a membrane mirror of the MEMS device 400 includes the top mirror layer 422 and the dielectric layer 420. In some embodiments, protruding portions of the dielectric layer 420 and bottom mirror layer 418 form center posts of the MEMS device 400.

In some embodiments, after the MEMS device 400 formed in FIG. 4G, a driver chip (not shown) (e.g., drive sources 166A, 166B; array driver 206) is attached to the glass substrate 404 (e.g., by anisotropic conductive film (ACF) bonding). In some embodiments, the driver chip is mounted on the glass substrate 404 (e.g., chip-on-glass). In some embodiments, the driver chip is mounted a flex cable (e.g., chip-on-flex) that is bonded to the MEMS device.

Figure 5A:
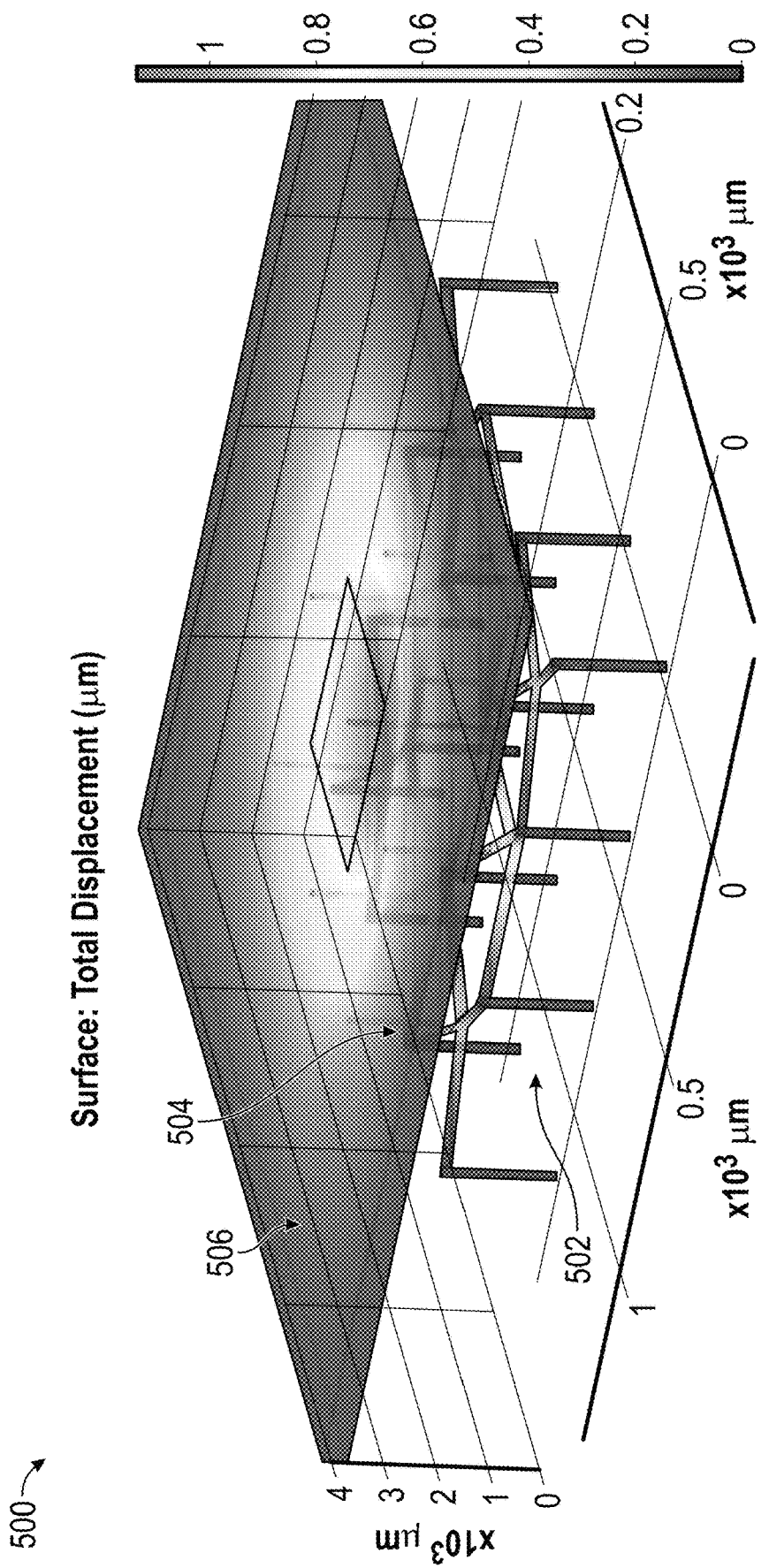
FIG. 5A illustrates an exemplary MEMS device, according to embodiments of the disclosure.

FIG. 5A illustrates an exemplary MEMS device 500, according to embodiments of the disclosure. In some embodiments, as illustrated, the MEMS device 500 includes a 3×3 array of electrodes (e.g., an array of pixels 156A-156D, pixels 202A-202I, electrodes 302, electrodes 408) (not shown), corresponding mechanical components (e.g., hinges 502, center posts 504), and corresponding portion of the membrane mirror 506. In some embodiments, the hinges 502 are tuned more stiffly, to reduce mechanical interactions between neighboring electrostatic actuators.

For example, as illustrated, a center electrode of the 3×3 array is being actuated. In some embodiments, a force applied by the center electrode is a charge-equivalent of 2 pC (e.g., 15V across a 150 fF capacitor). The hinges 502 are 10 μm×200 nm silicon nitride with tensile stress of 100 MPa. The membrane mirror 506 is a 500 nm thick metallized silicon dioxide film with a tensile stress of less or equal 10 MPa, advantageously reducing energy required to actuate the membrane mirror while meeting structural requirements. The shape of the membrane mirror 506 may be determined from superposition of single-electrode shape functions.

In some embodiments, curve 508A of FIG. 5B shows displacement across a middle portion (e.g., across a direction parallel to an axis of the electrode array) of the membrane mirror 506 when center electrode of the 3×3 array, with a pitch 512, being actuated and all electrodes of the 3×3 array are mechanically coupled to hinges 502. Curve 508B of FIG. 5B shows displacement across a diagonal portion (e.g., across a direction diagonal to axes of the electrode array) of the membrane mirror 506 when center electrode of the 3×3 array being actuated and all electrodes of the 3×3 array are mechanically coupled to hinges 502.

In some embodiments, curve 510A of FIG. 5B shows displacement across a middle portion of the membrane mirror 506 when center electrode of the 3×3 array being actuated and only the center electrode of the 3×3 array is mechanically coupled to a hinge. Curve 510B of FIG. 5B shows displacement across a diagonal portion of the membrane mirror 506 when center electrode of the 3×3 array being actuated and only the center electrode of the 3×3 array is mechanically coupled to a hinge.

Figure 6:
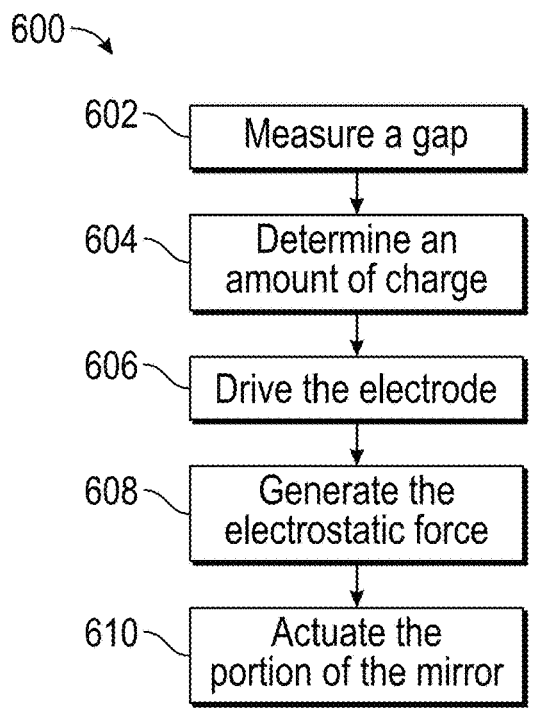
FIG. 6 illustrates a method of operating an exemplary MEMS device, according to embodiments of the disclosure.

FIG. 6 illustrates a method 600 of operating an exemplary MEMS device, according to embodiments of the disclosure. In some embodiments, the method 600 is performed with a system comprising a DM (e.g., MEMS device 100, MEMS device 150, circuit 200, MEMS device 300, MEMS device 400, MEMS device 500). For the sake of brevity, some elements and advantages associated with these systems are not repeated here. Although the method 600 is illustrated as including the described steps, it is understood that different order of step, additional step (e.g., combination with other methods disclosed herein), or less step may be included without departing from the scope of the disclosure. For example, steps of method 600 may be performed with steps of method 900.

In some embodiments, the method 600 includes measuring, through a glass substrate and an electrode, a gap between the electrode and a portion of a membrane mirror (step 602). For example, as described with respect to FIGS. 1-5, a gap between a disclosed electrode and a disclosed membrane mirror is measured. In some embodiment, the gap between the electrode and the portion of the membrane mirror is measured using a laser through the glass substrate and the electrode.

In some embodiments, the method 600 includes determining, based on the measured gap, an amount of charge for generating an electrostatic force for actuating the portion of the membrane mirror (step 604). For example, as described with respect to FIGS. 1-5, a topography of a membrane mirror and required electrostatic forces for generating the topography are determined. Based on the measured gaps, amounts of charge (e.g., for each actuator) needed to generate the electrostatic forces are determined to generate the topography.

In some embodiments, the method 600 includes driving the electrode with a drive signal having an amplitude to charge the electrode to the amount of charge (step 606). For example, as described with respect to FIGS. 1-5, a disclosed drive source or array driver drives an electrically coupled electrode with a drive signal having an amplitude (e.g., a short voltage pulse of amplitude V) to charge the electrode to the amount of charge (e.g., Q=CV, where C is the capacitance between the electrode and the portion of the membrane mirror).

In some embodiments, the method 600 includes generating, with the amount of charge, the electrostatic force (step 608). For example, as described with respect to FIGS. 1-5, the charges on electrode generate an electrostatic force on the portion of the membrane mirror.

In some embodiments, the method 600 includes actuating, using the electrostatic force, the portion of the membrane mirror (step 610). For example, as described with respect to FIGS. 1-5, with the electrostatic force generated by charges on the electrode, the portion of the membrane mirror is actuated to generate a desired topography.

In some embodiments, the method 600 includes turning on a first TFT to electrically couple the electrode to a first column line, wherein driving the electrode with the drive signal comprises driving the first column line with the drive signal; turning on a second TFT to electrically couple a second electrode to a second column line; driving the second electrode with a second drive signal having a second amplitude to charge the second electrode to a second amount of charge comprising driving the second column line with the second drive signal; generating, with the second amount of charge, a second electrostatic force; and actuating, using the second electrostatic force, a second portion of the membrane mirror. In some embodiments, the first and second electrodes belong to a same row of electrodes. For example, as described with respect to FIGS. 1-5, a first electrode and a second electrode of a same row are charged by a respective drive signal from a respective drive source.

In some embodiments, the method 600 includes turning on a first TFT to electrically couple the electrode to a column line, wherein driving the electrode with the first drive signal comprises driving the column line with the first drive signal; turning off the first TFT to electrically uncouple the first electrode from the column line; turning on a second TFT to electrically couple a second electrode to the column line; driving the second electrode with a second drive signal having a second amplitude to charge the second electrode to a second amount of charge comprising driving the column line with the second drive signal; generating, with the second amount of charge, a second electrostatic force; and actuating, using the second electrostatic force, a second portion of the membrane mirror. For example, as described with respect to FIGS. 1-5, a first electrode and a second electrode of a same column and different rows are scanned at different times and are charged by a respective drive signal at the different scanning times.

In some embodiments, the method 600 includes measuring, through the glass substrate and the electrode, a second gap between the electrode and the portion of a membrane mirror, wherein the first electrostatic force causes a gap between the electrode and the portion of the membrane mirror to change from the first gap to the second gap; determining, based on the measured second gap, a second amount of charge for generating a second electrostatic force for actuating the portion of the membrane mirror; driving the electrode with a second drive signal having a second amplitude to charge the electrode to the second amount of charge; generating, with the second amount of charge, the second electrostatic force; and actuating, using the second electrostatic force, the portion of the membrane mirror. For example, as described with respect to FIGS. 1-5, at a subsequent cycle, the membrane mirror is measured again and a new electrostatic force is generated, as described herein, to generate a second desired mirror topography.

In some embodiments, the method 600 includes measuring, through the glass substrate and a second electrode, a second gap between the second electrode and a second portion of the membrane mirror; determining, based on the measured second gap, a second amount of charge for generating a second electrostatic force for actuating the second portion of the membrane mirror; driving the second electrode with a second drive signal having a second amplitude to charge the second electrode to the second amount of charge; generating, with the second amount of charge, the second electrostatic force; and actuating, using the second electrostatic force, the second portion of the membrane mirror. For example, as described with respect to FIGS. 1-5, at a subsequent cycle, the membrane mirror is measured at a second location and a second electrostatic force is generated, as described herein, to generate the desired mirror topography.

Figure 7:
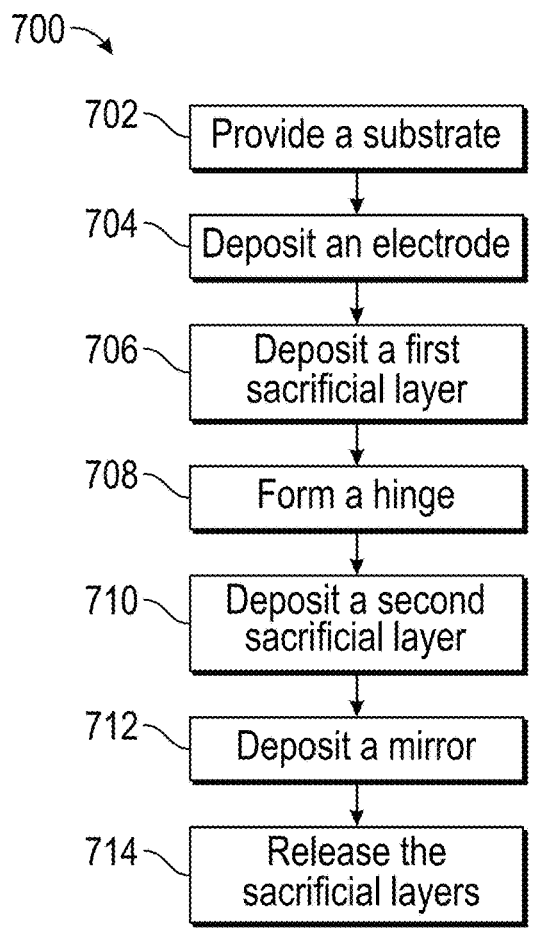
FIG. 7 illustrates a method of manufacturing an exemplary MEMS device, according to embodiments of the disclosure.

FIG. 7 illustrates a method 700 of manufacturing an exemplary MEMS device, according to embodiments of the disclosure. In some embodiments, the method 700 is method of manufacturing a system comprising a DM (e.g., MEMS device 100, MEMS device 150, circuit 200, MEMS device 300, MEMS device 400, MEMS device 500). For the sake of brevity, some elements and advantages associated with these systems are not repeated here. Although the method 700 is illustrated as including the described steps, it is understood that different order of step, additional step (e.g., combination with other methods disclosed herein), or less step may be included without departing from the scope of the disclosure.

In some embodiments, the method 700 includes providing a glass substrate (step 702). For example, as described herein, a disclosed glass substrate is provided.

In some embodiments, the method 700 includes depositing an electrode on the glass substrate (step 704). For example, as described with respect to FIGS. 1-5, a disclosed electrode is deposited on a disclosed glass substrate. In some embodiments, the electrode is a transparent electrode.

In some embodiments, the method 700 includes depositing a first sacrificial layer (step 706). For example, as described with respect to FIGS. 4A-4G, a first sacrificial layer 412 is deposited.

In some embodiments, the method 700 includes forming a hinge (step 708). For example, as described with respect to FIGS. 1-5, a disclosed hinge is formed. In some embodiments, the hinge is mechanically coupled to the electrode.

In some embodiments, the method 700 includes depositing a second sacrificial layer (step 710). For example, as described with respect to FIGS. 4A-4G, a second sacrificial layer 416 is deposited.

In some embodiments, the method 700 includes depositing a membrane mirror above the second sacrificial layer (step 712). For example, as described with respect to FIGS. 1-5, a disclosed membrane mirror is deposited on a disclosed MEMS device. In some embodiments, the membrane mirror is mechanically coupled to the hinge.

In some embodiments, the method 700 includes releasing the first and second sacrificial layers (step 714). For example, as described with respect to FIGS. 4A-4G, the sacrificial layers are released.

In some embodiments, the method 700 includes creating openings in the glass substrate, in the membrane mirror, or in both. For example, as described with respect to FIGS. 1-5, a disclosed opening or hole in a glass substrate, in the membrane mirror, or in both is created. In some embodiments, releasing the first and second sacrificial layers comprises releasing the first and second sacrificial layers through the openings. For example, as described with respect to FIGS. 1-5, the first and sacrificial layers are released through a disclosed opening or hole in a glass substrate, in the membrane mirror, or in both.

In some embodiments, the method 700 includes electrically coupling a driver chip to the MEMS device. For example, as described with respect to FIGS. 1-5, a drive chip (e.g., including circuit 200) is electrically coupled to a disclosed MEMS device.

In some embodiments, the method 700 depositing the membrane mirror includes: depositing a bottom mirror layer; depositing a dielectric layer; and depositing a top mirror layer. For example, as described with respect to FIGS. 4A-4G, depositing the membrane mirror includes depositing a bottom mirror layer 418, depositing a dielectric layer 420, and depositing a top mirror layer 422.

Figure 8A:
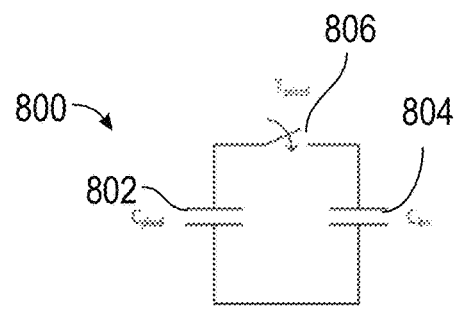
FIGS. 8A-8C illustrate an exemplary charge transfer circuit, according to embodiments of the disclosure.

FIG. 8A illustrates an exemplary charge transfer circuit 800, according to embodiments of the disclosure. In some embodiments, the charge transfer circuit 800 is electrically coupled to a disclosed pixel (e.g., pixels 156A-156D of FIG. 1B, pixels 202A-202I of FIG. 2, electrodes 302 of FIGS. 3A and 3B, electrodes 408 of FIGS. 4A-4G) and is configured to provide charge for actuating a corresponding area of a disclosed mirror (such as membrane mirrors 158 and 306 described with respect to FIGS. 1B, 3A, and 3B, and top mirror layer 422 described with respect to FIG. 4G). For example, the charge transfer circuit 800 drives a disclosed pixel or electrode (e.g., pixels 156A-156D of FIG. 1B, pixels 202A-202I of FIG. 2, electrodes 302 of FIGS. 3A and 3B, electrodes 408 of FIGS. 4A-4G) (e.g., in conjunction with a drive source, in lieu of a drive source). In some embodiments, a disclosed MEMS device (e.g., MEMS device 100, 150, 300, 400, 500; MEMS device circuit 200) includes a plurality of transfer circuits 800 for transferring charge to a pixel or electrode array of the MEMS device.

As illustrated, the charge transfer circuit 800 drives pixel 802 (represented by a capacitor having a capacitance $C_{pixel}$). In some embodiments, the pixel 802 is a disclosed pixel or electrode (e.g., pixels 156A-156D of FIG. 1B, pixels 202A-202I of FIG. 2, electrodes 302 of FIGS. 3A and 3B, electrodes 408 of FIGS. 4A-4G). In some embodiments, the charge transfer circuit 800 provides a charge to the pixel 802. As described herein, the charge changes a distance of a gap of the pixel 802, and the change in gap actuates an area of a MEMS mirror mechanically coupled to the pixel.

In some embodiments, the charge transfer circuit 800 is configured to control a charge transfer to the pixel 802. In some embodiments, the charge transfer circuit 800 includes an intermediate capacitor 804 (having a capacitance $C_{int}$) that is precharged to a voltage $V_{int}$. The pixel switch $T_{pixel}$ 806 is configured to close while some or all of the charge from the intermediate capacitor 804 is transferred to the pixel 802. In some embodiments, the switch 806 has a sufficient on/off ratio. For example, the ratio is around $10^9$. In some embodiments, the pixel switch 806 is a TFT transistor. Circuitries for precharging the intermediate capacitor and controlling the pixel switch are not shown in FIG. 8A. After the transfer, an amount of charge on the pixel is changed by $$\frac{C_{pixel}\Delta V}{1 + C_{pixel}/C_{int}} \tag{1}$$

Where $\Delta V$ is a voltage difference between the intermediate capacitor and the pixel before the pixel switch closes and connects the intermediate capacitor and the pixel for charge transfer, and $C_{pixel}$ is the capacitance of the pixel 802. As an exemplary advantage, the disclosed charge transfer circuits and the disclosed methods of operating the charge transfer circuits prevent snap-down during transfer.

In some instances, the voltage across the pixel may not be accurately known because the transferred charge may change the gap across the pixel (e.g., the upper electrode may move to a new position), changing the capacitance and the voltage of the pixel. Advantageously, using the charge transfer circuit 800, the voltage across the pixel may be determined if the gap change is within the first ⅓ of the pixel's travel range (e.g., there is a one-to-one correspondence between voltage and the gap change). In some embodiments, the pixel's travel range is a full range of motion allowed by the mechanics of the mirror (e.g., ranging from 0 to a maximum gap between the mirror and the substrate). If the charge transfer described with respect to equation (1) repeats, then the pixel may eventually move to and stabilize at a position correspond to the voltage $V_{int}$. Using this method, the voltage on the intermediate capacitor may be increased to move the pixel down (e.g., to actuate the mirror down), or the voltage on the intermediate capacitor may be decreased to move the pixel up (e.g., to actuate the mirror up). An advantage of this method may be that a circuit implementing this method may not require additional voltage measurement circuitry (e.g., to measure the voltage of the pixel).

It may be desirable to actuate a pixel beyond ⅓ of the pixel's travel range. To actuate a pixel beyond ⅓ of the pixel's travel range, in some embodiments, the pixel voltage is determined (e.g., to accurately determine a gap change beyond ⅓ of the pixel's travel range). It may also be desirable to provide additional resolution for controlling the pixel gap, allowing better control of the MEMS mirror.

Figure 8B:
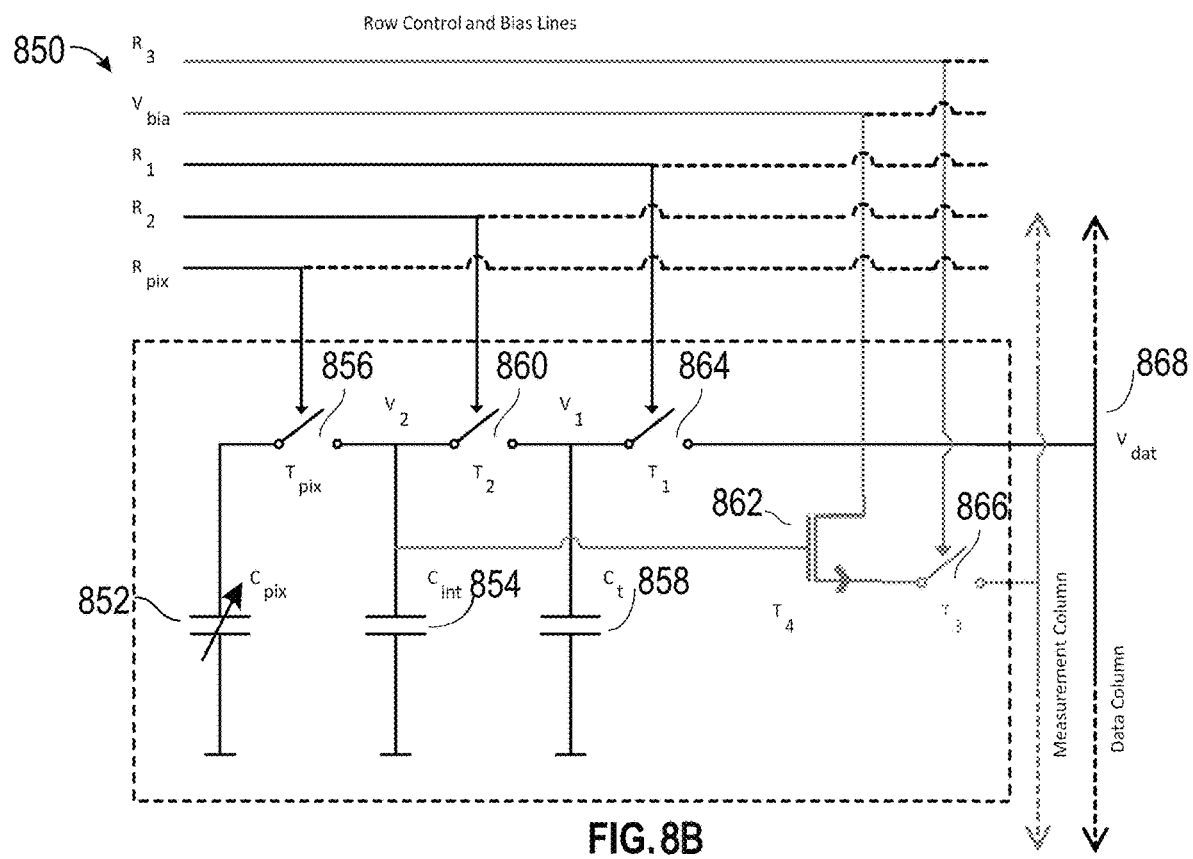

FIG. 8B illustrates an exemplary charge transfer circuit 850, according to embodiments of the disclosure. In some embodiments, the charge transfer circuit 850 is electrically coupled to a disclosed pixel (e.g., pixels 156A-156D of FIG. 1B, pixels 202A-202I of FIG. 2, electrodes 302 of FIGS. 3A and 3B, electrodes 408 of FIGS. 4A-4G) and is configured to provide charge for actuating a corresponding area of a disclosed mirror (such as membrane mirrors 158 and 306 described with respect to FIGS. 1B, 3A, and 3B, and top mirror layer 422 described with respect to FIG. 4G). For example, the charge transfer circuit 850 drives a disclosed pixel or electrode (e.g., pixels 156A-156D of FIG. 1B, pixels 202A-202I of FIG. 2, electrodes 302 of FIGS. 3A and 3B, electrodes 408 of FIGS. 4A-4G) (e.g., in conjunction with a drive source, in lieu of a drive source). In some embodiments, a disclosed MEMS device (e.g., MEMS device 100, 150, 300, 400, 500; MEMS device circuit 200) includes a plurality of transfer circuits 850 for transferring charge to a pixel or electrode array of the MEMS device.

In some embodiments, the charge transfer circuit 850 is configured to change a pixel gap (e.g., beyond fraction (e.g., ⅓) of the pixel's travel range) by controlling a charge transfer to/from the pixel 852 (represented by a capacitor having a capacitance $C_{pix}$). In some embodiments, the charge transfer circuit 850 is configured to measure the voltages of an intermediate capacitor (e.g., intermediate capacitor 854) before and after a charge transfer (e.g., charge transfer between pixel 852 and intermediate capacitor 854 via pixel switch 856). In some embodiments, the pixel 852 is pixel 802, the intermediate capacitor 854 is intermediate capacitor 804, and the pixel switch 856 is pixel switch 806.

By determining the voltages of the intermediate capacitor before and after the transfer, an amount of charge transferred between the pixel 852 and intermediate capacitor 854 can be determined. For example, before the transfer, if the voltage of the intermediate capacitor 854 is higher than the voltage of the pixel 852, then charge is added to the pixel 852 from the intermediate capacitor 854, causing the pixel gap to decrease. As another example, if the voltage of the intermediate capacitor 854 is lower than the voltage of the pixel 852, then charge is subtracted from the pixel 852 and added to the intermediate capacitor 854, causing the pixel gap to increase.

By determining the amount of charge transferred, the new pixel voltage and corresponding new gap distance can be determined. In some embodiments, the amount of charge added to or subtracted from the pixel 852 is controlled (e.g., using the $R_{pix}$ signal) by an amount of time the pixel switch 856 is closed (e.g., the longer time the pixel switch is closed, the greater the magnitude of addition or subtraction).

For example, as illustrated, charge transfer circuit 850 includes pixel 852, intermediate capacitor 854 (having a capacitance $C_{int}$), capacitor 858 (having a capacitance $C_t$), pixel switch 856, switch 860, switch 864, switch 866, and sensing transistor 862. In some embodiments, the pixel switch 856, switch 860, switch 864, and sensing transistor 862 are TFT transistors. In some embodiments, sensing transistor 862 is an NMOS transistor and forms a source follower. For example, the voltage on intermediate capacitor 854 is outputted by the sensing transistor 862 (e.g., scaled by the gate-to-source voltage of the sensing transistor 862) to the switch 866. In some embodiments, the output voltage of the sensing transistor 862 is sampled to determine a charge on the intermediate capacitor 862 (e.g., via switch 866 and an amplifier (e.g., an op amp) electrically coupled to the measurement column), and hence, an amount of charge being transferred between the intermediate capacitor 862 and the pixel 825 and a displacement of the pixel 852. In some embodiments, the switches 860 and 864 are configured to reduce switch leakage between charge transfers.

In some embodiments, the charge transfer circuit 850 functions as an intrapixel digital-to-analog converter (DAC). Specifically, charge transfers between capacitor 858 and intermediate capacitor 854 allow the actuation of pixel 852 to have better resolution, compared to a resolution of a voltage directly provided to the intermediate capacitor 854.

Figure 8C:
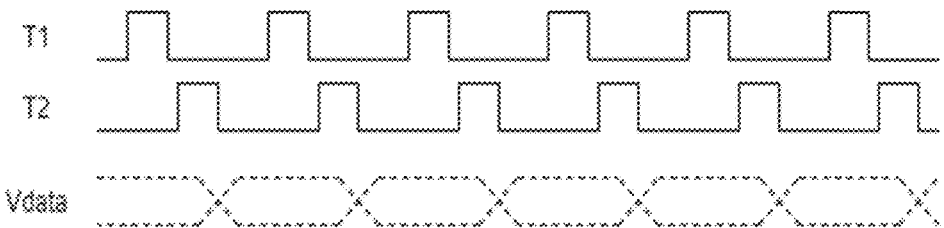

In some embodiments, the signal $R_1$, which controls the switch 864, and the signal $R_2$, which controls the switch 860, are complementary and associated with a row of pixels (e.g., the signals $R_1$ and $R_2$ control a same row of pixels). Exemplary timing of the signals $R_1$ and $R_2$ for turning on switches 864 and 860, respectively, are illustrated in FIG. 8C. It is understood that the waveforms may not be drawn to scale.

In some embodiments, a voltage $V_{data}$ (e.g., a column voltage) is provided to the charge transfer circuit 850 via a data line 868. In some embodiments, the voltage $V_{data}$ is provided by a display voltage driver (e.g., drive source 166A-B, array driver 206). In some embodiments, the resolution (e.g., 6-10 bits resolution) of $V_{data}$ depends on the resolution of the display voltage driver. As described in more detail herein, the charge transfer circuit 850 functions as an intrapixel digital-to-analog converter (DAC) and advantageously allows the pixel 852 to be controlled at resolutions (e.g., higher than 6-10 bits resolution) higher than the resolution of $V_{data}$. Exemplary timing of the $V_{data}$ signal is illustrated in FIG. 8C. It is understood that the waveform may not be drawn to scale.

In some embodiments, as illustrated in FIG. 8C, at each clock cycle, $V_{data}$ is set to a particular value (e.g., to $V_k$ or $V_{k+1}$ (described in more detail below) before switch 864 is turned on by the signal $R_1$). When $V_{data}$ is at or is moving to the particular value, switch 864 is turned on by the signal $R_1$, allowing capacitor 858 to be charged to $V_k$ or $V_{k+1}$. After the capacitor 858 is charged to $V_k$ or $V_{k+1}$, switch 864 is turned off by the signal $R_1$, and switch 860 is turned on by the signal $R_2$, allowing the capacitor 858 to transfer some or all of its charge to the intermediate capacitor 854.

In some embodiments, the process of charging capacitor 858 to $V_k$ or $V_{k+1}$ and transferring its charge to intermediate capacitor 854 is repeated. For example, the process of charging capacitor 858 to $V_k$ or $V_{k+1}$ and transferring its charge to intermediate capacitor 854 is repeated until a desired intermediate capacitor voltage (e.g., a voltage for achieving a desired pixel gap for actuating a corresponding area of a membrane mirror) is reached. In some embodiments, after a desired intermediate capacitor voltage is reached, the pixel switch 856 is turned on by $R_{pix}$, allowing some or all of the charge to be transferred between the intermediate capacitor 854 and pixel 852 (e.g., as described with respect to FIG. 8A).

In some embodiments, the charge transfer is active. For example, an amplifier (not shown) is used to aid the transfer of charge between the intermediate capacitor 854 and pixel 852. In some embodiments, the charge transfer is passive. For example, no amplifier is used to aid the transfer of charge between the intermediate capacitor 854 and pixel 852 (e.g., as described with respect to FIG. 8B).

As mentioned above, charge transfers between capacitor 858 and intermediate capacitor 854 allow the actuation of pixel 852 to have better resolution, compared to a resolution of $V_{data}$. In some embodiments, the voltage of the intermediate capacitor 854 has a higher resolution than $V_{data}$ by controlling the charge transfer between the capacitor 858 and the intermediate capacitor 854.

In some embodiments, a ratio of charge transfer between capacitor 858 and intermediate capacitor 854 is defined as:

$$r = \frac{C_{int}}{C_{int} + C_t} \quad (2)$$

In some embodiments, the charge on the intermediate capacitor 854 is initially $Q_0$ (e.g., zero after reset, which, in some embodiments, is achieved by closing switches 860 and 864 at a same time and setting $V_{data}$ to zero). After switch 864 closes and allows $V_{data}$ to charge capacitor 858 (e.g., the capacitor 858 is charged to $V_k$ or $V_{k+1}$), the charge on the capacitor 858 is defined as $Q_{t1}$. After the capacitor 858 is charged, as described above, charge is transferred between the capacitor 858 and the intermediate capacitor 854, and the charge on the intermediate capacitor 854 is:

$$Q_1 = (Q_0 + Q_{t1})r \quad (3)$$

In some embodiments, the charge transfer between the intermediate capacitor 854 and the pixel 852 is completed in a shorter duration (e.g., less than 0.1 µs) than a mechanical response time of a pixel (e.g., a mechanical time constant associated with pixel resonance of greater than 100 s).

In some embodiments, the process of transferring charge between the capacitor 858 and the intermediate capacitor 854 is repeated. Therefore, after another iteration of this transfer, the charge on the intermediate capacitor 854 is:

$$Q_2 = (Q_1 + Q_{t2})r = ((Q_0 + Q_{t1})r + Q_{t2})r \quad (4)$$

More generally, after N transfers, the charge on the intermediate capacitor 854 is:

$$Q_N = (Q_{N-1} + Q_{tN})r = rQ_{tN} + r^2 Q_{tN-1} + \ldots + r^{N-1} Q_{t2} + r^N Q_{t1} \quad (5)$$

That is, the charge on the intermediate capacitor 854 may be expressed as a base-r numeral system determined by $Q_{tN}$.

For example, if $V_{data}$ has one-bit resolution (e.g., possible values of $V_{data}$ are V and 0) and $C_{int} = C_t$ (so r=½), then:

$$Q_N = \frac{C_t V}{2^N}\left(D_N 2^{N-1} + D_{N-1} 2^{N-2} + \ldots + D_2 2^1 + D_1 2^0\right) \quad (6)$$

In this example, equation (6) shows that the charge transfer circuit 850 can function as an N-bit DAC coded by numbers $D_N D_{N-1} \ldots D_2 D_1$, wherein $D_i$ is either 0 or 1; $Q_N$ is a value between 0 and $$C_t V\left(1 - \frac{1}{2^N}\right),$$

in steps of $$\frac{1}{2^N} V C_t.$$

In some embodiments, the binary numbers $D_i$ allows the monotonicity of the DAC input to output mapping to be guaranteed (e.g., the linearity of $V_{data}$ would not affect the monotonicity of the DAC), as long as the two values are not equal.

As another example, $V_{data}$ has two-bit resolution (e.g., possible values of $V_{data}$ are 0, $V_1$, $V_2$, and $V_3$) and $3C_{int} = C_t$ (so r=¼), then:

$$Q_N = \frac{C_t V}{4^N}\left(D_N 4^{N-1} + D_{N-1} 4^{N-2} + \ldots + D_2 4^1 + D_1 4^0\right) \quad (7)$$

In this example, equation (7) shows that the charge transfer circuit 850 can function as an N-bit DAC coded by base-4 numbers $D_N D_{N-1} \ldots D_2 D_1$, where $D_i$ can be 0, 1, 2, or 3; $Q_N$ may a value between 0 and $VC_t(1-¼^N)$ in steps of $$\frac{1}{4^N} V C_t.$$

For brevity, other examples of the N-bit DAC using different $V_{data}$ resolution, $C_{int}$ value, and $C_t$ value are not described. From the above equations, in general, each clock cycle of charge transfer between the capacitor 858 and the intermediate capacitor 854 adds a bit of resolution to the intrapixel DAC.

In some embodiments, $V_{data}$ has a 6-bit resolution (e.g., possible values of $V_{data}$ are 0, $V_1$, $V_2$, . . . , $V_{63}$). For example, $V_{data}$ is provided by a 6-bit display driver. From the above equations, the charge transfer circuit 850 allows the voltage of the intermediate capacitor 854 to have a resolution of 6+N bits (e.g., there are N possible values between adjacent $V_{data}$ values $V_k$ and $V_{k+1}$).

In some embodiments, the charge transfer circuit 850 allows the intermediate capacitor to receive a voltage and the pixel to be actuated at a resolution finer than that of $V_{data}$. In some embodiments, the resolution of a MEMS mirror is dictated by a matching accuracy between the capacitor 858 and the intermediate capacitor 854, which is a finer resolution than that of $V_{data}$.

For example, if $C_{int} = C_t = 15$ fF and there is a 5% maximum capacitor mismatch associated with the fabrication process, the relationship between $C_{int}$ and $C_t$ would be:

$$C_t = C_{int}(1 \pm 0.05) \quad (8)$$

From the above equations, the term r would be:

$$r \cong \frac{1}{2}(1 \pm 0.025) \quad (9)$$

In this example, a 5% capacitor mismatch would allow the charge transfer circuit 850 to have N=5 bits resolution (if $V_{data}$ has 8-bit resolution, then the MEMS mirror has 13-bit resolution) because monotonicity may no longer be maintained at 6 bits. For example, with a 5% maximum mismatch and for a 6-bit number, the binary number $100000_2$ corresponds to r=0.5125, and $011111_2$ corresponds to $r^2 + r^3 + r^4 + r^5 + r^6 = 0.52$. Because $$2^6 > \frac{1}{0.025} = 40 > 2^5,$$

it is possible to create a 5-bit DAC with a 5% capacitor mismatch, but it may not be possible to create a 6-bit DAC.

In another example, if there is a 1% maximum capacitor mismatch associated with the fabrication process, then the charge transfer circuit 850 to have N=7 bits resolution (if $V_{data}$ has 8-bit resolution, then the MEMS mirror has 15-bit resolution).

These examples show that the charge transfer circuit 850 advantageously allows the MEMS mirror to be actuated at a higher resolution (e.g., compared to a charge driven method without the charge transfer circuit 850, compared to a voltage driven method). In some embodiments, the dimensions of the pixel 852 further increase precision for controlling the pixel. For example, as shown in equation (1), the charge transferred onto the pixel 852 from the intermediate capacitor 854 is $$\frac{C_{pixel}\Delta V}{1 + C_{pixel}/C_{int}}$$

where $\Delta V$ is the voltage difference between the two capacitors before the charge transfer. From the above example, $C_{int}$ is 15 fF. For a pixel that comprises a pair of 100 µm square electrodes separated by 3 µm, $C_{pixel}$ is 30 fF; thus, the charge transferred between the capacitor is $\Delta V/3$. For a pixel that comprises a pair of 200 µm square electrodes separated by 2 m, $C_{pixel}$ is 180 fF; thus, the charge transferred between the capacitor is $\Delta V/12$. Increasing the size of the pixel in this example allows an additional 1.5 to 3.5 bits of dynamic range for controlling pixel voltage.

A specific example of operating charge transfer circuit 850 is now described. In this example, the charge transfer circuit 850 is configured to add 2 bits of resolution to the MEMS mirror (in addition to the resolution of $V_{data}$). That is, the charge transfer circuit 850 is configured to add three additional voltage levels between adjacent voltage levels of $V_{data}$. For example, a level of $V_{data}$ is $V_k$ and a next higher level of $V_{data}$ is $V_{k+1}$. In some embodiments, the charge transfer circuit 850 is configured to generate three additional voltage levels $V_{k+0.25}$ (e.g., $V_k+0.25(V_{k+1}-V_k)$), $V_{k+0.5}$ (e.g., $V_k+0.5(V_{k+1}-V_k)$), $V_{k+0.75}$ (e.g., $V_k+0.75(V_{k+1}-V_k)$) between $V_k$ and $V_{k+1}$. For brevity, a 2-bit example is described, it is understood that the charge transfer circuit 850 may be operated to achieve higher resolution and/or may operate under different parameters.

In this example, $C_t=C_{int}=C$. As an initial step, the switches 864 and 860 are closed to reset the capacitors 858 and 854 to $V_k$ (e.g., via data line 868). After the capacitors are reset, switch 860 opens, switch 864 closes, and the capacitor 858 is charged to $V_{k+1}$ (e.g., via data line 868). After the capacitor 858 is charged to $V_{k+1}$, switch 864 opens and switch 860 closes, because capacitances of the capacitors 854 and 858 are equal, the voltage across the two capacitors would be $(V_k+V_{k+1})/2=V_{k+0.5}$. In some embodiments, this would represent the binary value $10_2$.

In a first scenario, to achieve the voltage $V_{k+0.25}$—after the voltage across the two capacitors reach $(V_k+V_{k+1})/2=V_{k+0.5}$, switch 860 opens, switch 864 closes, and the capacitor 858 is charged to $V_k$ (e.g., via data line 868). After the capacitor 858 is charged to $V_k$, switch 864 opens and switch 860 closes, because capacitances of the capacitors 854 and 858 are equal, the voltage across the two capacitors would be $(V_{k+0.5}+V_k)/2=V_{k+0.25}$. In some embodiments, this would represent the binary value $01_2$.

In a second scenario, to achieve the voltage $V_{k+0.75}$—after the voltage across the two capacitors reach $(V_k+V_{k+1})/2=V_{k+0.5}$, switch 860 opens, switch 864 closes, and the capacitor 858 is charged to $V_{k+1}$ (e.g., via data line 868). After the capacitor 858 is charged to $V_{k+1}$, switch 864 opens and switch 860 closes, because capacitances of the capacitors 854 and 858 are equal, the voltage across the two capacitors would be $(V_{k+0.5}+V_{k+1})/2=V_{k+0.75}$. In some embodiments, this would represent the binary value $11_2$.

In some embodiments, generally, the above steps are repeated to achieve greater resolution by averaging $V_k$ or $V_{k+1}$ with a voltage of the intermediate capacitor 854. As described above, in some embodiments, these steps are performed N times, where N is dependent on mismatch between the capacitor 858 and intermediate capacitor 854. In some embodiments, after a desired intermediate capacitor voltage is reached, the pixel switch 856 is turned on by $R_{pix}$, allowing some or all of the charge to be transferred between the intermediate capacitor 854 and pixel 852 (e.g., as described with respect to FIG. 8A).

It is understood that the elements of charge transfer circuit described with respect to FIG. 8B are exemplary. In some embodiments, the charge transfer circuit may include additional or fewer elements than illustrated. For example, in some embodiments, the charge transfer circuit includes pixel 852, intermediate capacitor 854, pixel switch 856, sensing transistor 862, and switch 866. As another example, For example, in some embodiments, the charge transfer circuit includes pixel 852, intermediate capacitor 854, pixel switch 856, capacitor 858, and switch 864.

In some embodiments, leakage currents flow through the switches 856, 860, and 864. The leakage current may cause a drift on a corresponding area of a MEMS mirror (e.g., due to the leakage current, pixel 852 loses charge). In some embodiments, the drift rate is defined by:

$$\Delta x = \frac{Q\Delta Q}{k\epsilon_0 A} \tag{10}$$

Where $\Delta Q$ is charge leakage, k is a spring constant of the mirror, and A is an area of the pixel. For example, the leakage current is 1 fA, the spring constant is k=5 N/mm, the area of the pixel is $A=300^2$ µm$^2$, and the pixel has a maximum stroke of 1 µm (e.g., the drift rate decreases with a shorter stroke). The drift rate in this example is 1 nm/s. In some embodiments, the mirror's update speed satisfies a drift requirement (e.g., such that the 1 nm/s drift would not cause the mirror to drift beyond the requirement).

In some embodiments, the drive source (e.g., drive source 166, array driver 206, a driver providing $V_{data}$) is configured to provide a voltage quickly enough to satisfy the drift requirement. For example, the drive source is a display driver, and it updates at a 162 fps frame update frame. If the drift rate is 1 nm/s, the corresponding drift using this display driver would be 6.2 pm.

In some embodiments, the drift requirement is 5 pm. To meet this requirement using this display driver under these leakage conditions, in some embodiments, the pixel area is increased (e.g., from $A=300^2$ m$^2$ to $A=400^2$ m$^2$) to reduce the drift rate, and hence, the drift (e.g., from 6.2 pm to 4.6 pm). In some embodiments, a second drive source is used to drive the pixels in parallel; adding a second drive source would double the update rate.

In some embodiments, TFTs having lower leakage currents are used to reduce the leakage current and hence, the draft rate and the drift. For example, IGZO (Indium Gallium Zinc Oxide) TFTs, which has 1000× less leakage current than LTPS TFTs, are used. In some examples, the IGZO TFTs have a leakage current of 0.05 fA, and at 30 fps, the drift would be 1.7 pm.

Figure 9:
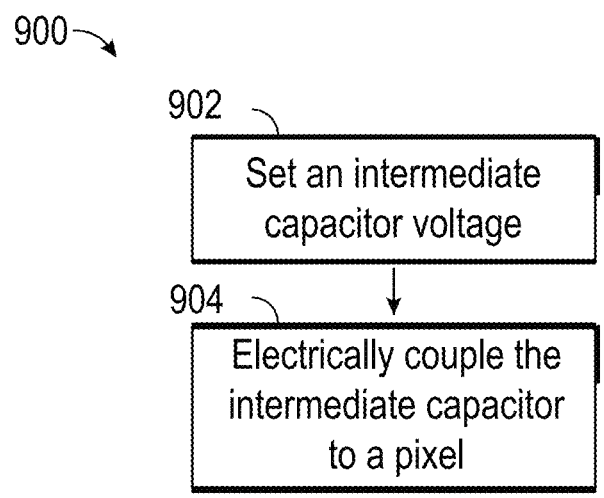
FIG. 9 illustrates a method of operating an exemplary charge transfer circuit, according to embodiments of the disclosure.

FIG. 9 illustrates a method 900 of operating an exemplary MEMS device, according to embodiments of the disclosure. In some embodiments, the method 900 is performed with a system comprising a DM (e.g., MEMS device 100, MEMS device 150, circuit 200, MEMS device 300, MEMS device 400, MEMS device 500) that comprises a charge transfer circuit (e.g., charge transfer circuit 800, charge transfer circuit 850). For the sake of brevity, some elements and advantages associated with these systems are not repeated here. Although the method 900 is illustrated as including the described steps, it is understood that different orders of steps, additional steps (e.g., combination with other methods disclosed herein), or less steps may be included without departing from the scope of the disclosure. For example, steps of method 900 may be performed with steps of method 600.

In some embodiments, the method 900 includes setting a voltage of an intermediate capacitor (step 902). For example, as described with respect to FIG. 8B, the voltage of the intermediate capacitor 854 is set (e.g., to $V_k$, $V_{k+0.25}$, $V_{k+0.5}$, $V_{k+0.75}$, $V_{k+1}$).

In some embodiments, the method 900 includes electrically coupling the intermediate capacitor to a pixel at a first gap (step 904). In some embodiments, the voltage and electrical coupling cause a charge transfer between the intermediate capacitor and the pixel, and the charge transfer causes a change in an electrostatic force of the pixel and the pixel to change from the first gap to a second gap. For example, as described with respect to FIG. 8B, the intermediate capacitor 854 is coupled to the pixel 852. Charge is transfer between the intermediate capacitor 854 and the pixel 852 (e.g., due to coupling of the intermediate capacitor voltage to the pixel), and the charge transfer to or from the pixel 852 causes a change in an electrostatic force of the pixel 852 and the pixel gap changes.

In some embodiments, the method 900 includes setting a second voltage of a second capacitor; and electrically coupling the second capacitor to the intermediate capacitor to set the first voltage of the intermediate capacitor. For example, as described with respect to FIG. 8B, the capacitor 858 voltage is set (e.g., to $V_k$, $V_{k+1}$).

In some embodiments, prior to electrically coupling the second capacitor to the intermediate capacitor to set the first voltage of the intermediate capacitor, the intermediate capacitor is at a third voltage. In some embodiments, the first voltage of the intermediate capacitor is an equilibrium voltage between the electrically coupled second capacitor and the intermediate capacitor. For example, as described with respect to FIG. 8B, the capacitor 858 voltage is set (e.g., to $V_k$, $V_{k+1}$) while the intermediate capacitor 852 is at a different voltage. After the capacitor 858 and the intermediate capacitor 852 are coupled together, the two capacitor voltages are going to equalize and converge to set the voltage of the intermediate capacitor. For example, as described with respect to FIG. 8B, if the intermediate capacitor 852 is at $V_k$, the capacitor 858 is at $V_{k+1}$, and the capacitors have equal capacitances, then after the intermediate capacitor 852 and the capacitor 858 are coupled together, the voltages of the capacitors would equalize at $V_{k+0.5}$.

In some embodiments, the method 900 includes prior to setting the second voltage of the second capacitor, setting the second capacitor and the intermediate capacitor to a fourth voltage. For example, as described with respect to FIG. 8B, the intermediate capacitor 852 and the capacitor 858 are reset prior to a DAC operation.

In some embodiments, the method 900 includes measuring the voltage of the intermediate capacitor. For example, as described with respect to FIG. 8B, the transistor 862 and switch 866 are used to measure the voltage the intermediate capacitor 854.

Figure 10:
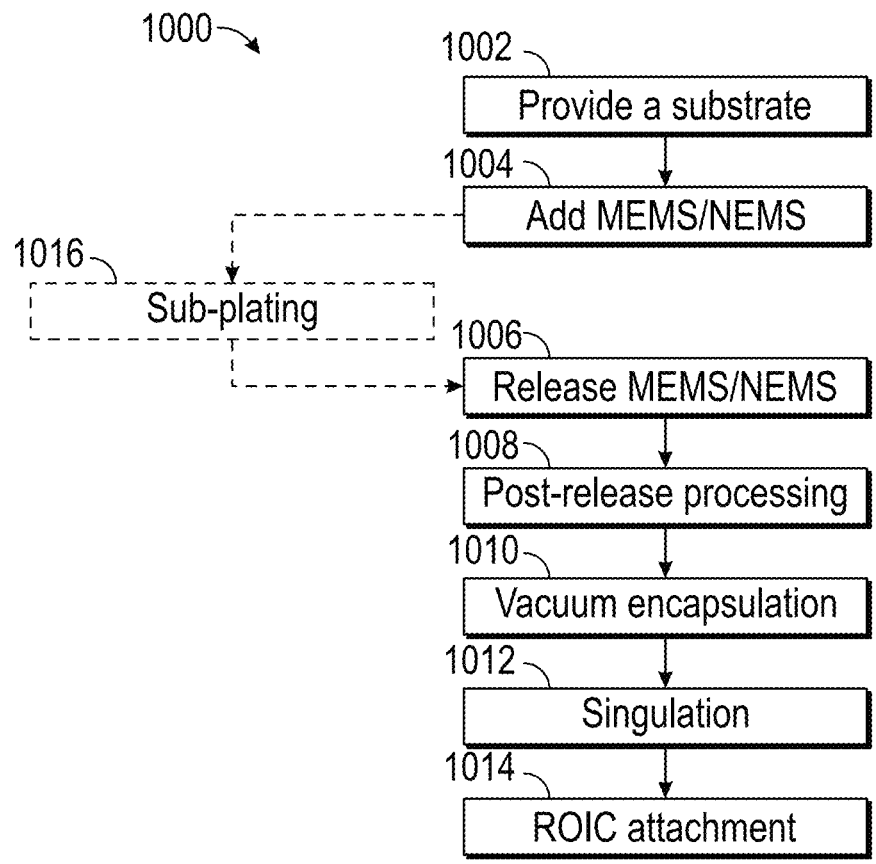
FIG. 10 illustrates a method of manufacturing an electromechanical system, according to embodiments of the disclosure.

FIG. 10 illustrates a method 1000 of manufacturing an electromechanical system, in accordance with an embodiment. As non-limiting examples, the electrochemical system could be associated with the devices (e.g., MEMS device 100, MEMS device 150, MEMS device 200, MEMS device 300, MEMS device 400, MEMS device 500) or systems described herein. To manufacture an electromechanical system, all or some of the process steps in method 1000 could be used and used in a different order. As a non-limiting example, Step 1014 could be performed before Step 1012. In some embodiments, the method 600, method 700, or method 900 can be performed with method 1000.

Method 1000 includes Step 1002, providing a substrate. In some embodiments, the substrate is made of glass. In some embodiments, the substrate is low temperature polycrystalline silicon. In some embodiments, the substrate is a borosilicate that contains additional elements to fine tune properties. An example of a borosilicate is by Corning Eagle™, which produces an alkaline earth boro aluminosilicate (a silicate loaded with boron, aluminum, and various alkaline earth elements). Other variations are available from Asahi Glass' or Schott™.

In some embodiments, a flat panel glass process is used to manufacture the electromechanical system. In some embodiments, a liquid crystal display (LCD) process is used to manufacture the electromechanical system. In some embodiments, an OLED display process or an x-ray panel process is used. Employing a flat panel glass process may allow for increased substrate sizes, thereby allowing for a higher number of electrochemical systems per substrate, which reduces processing costs. Substrate sizes for "Panel Level" can include 620 mm×750 mm, 680 mm×880 mm, 1100 mm×1300 mm, 1300 mm×1500 mm, 1500 mm×1850 mm, 1950 mm×2250 mm, and 2200 mm×2500 mm. Further, thin film transistors (TFTs) in panel level manufacturing can also reduce cost and so, for example, LCD-TFT processes can be beneficial.

Method 1000 includes Step 1004, adding MEMS to the substrate. Although MEMS is used to describe the addition of structures, it should be appreciated that other structures could be added without deviating from the scope of this disclosure. In embodiments using panel level processing, the MEMS structures may be added using an LCD-TFT process.

Step 1004 may be followed by optional Step 1016, sub-plating. Step 1016 may be used when the substrate is larger than the processing equipment used in subsequent steps. For example, if using a panel level process (such as LCD), some embodiments will include (at Step 1004) cutting the panel into wafer sizes to perform further processing (using, for example, CMOS manufacturing equipment). In other embodiments, the same size substrate is used throughout method 1000 (i.e., Step 1016 is not used).

Method 1000 includes Step 1006, releasing the MEMS from the substrate.

Method 1000 includes Step 1008, post-release processing. Such post-release processing may prepare the MEMS structure for further process steps, such as planarization. In wafer-level processing, planarization can include chemical mechanical planarization. In some embodiments, the further process steps include etch back, where a photoresist is spun onto the topography to generate a more planar surface, which is then etched. Higher control of the etch time can yield a smoother surface profile. In some embodiments, the further process steps include "spin on glass," where glass-loaded organic binder is spun onto the topography and the result is baked to drive off organic solvents, leaving behind a surface that is smoother.

Method 1000 includes Step 1010, vacuum encapsulation of the MEMS structure, where necessary. Vacuum encapsulation may be beneficial to prolong device life. In some embodiments, the MEMS device is packaged in dry atmosphere, in lieu of vacuum encapsulation. For example, a disclosed MEMS device is packaged in dry atmosphere (e.g., MEMS device 100, MEMS device 150, circuit 200, MEMS device 300, MEMS device 400, MEMS device 500).

Method 1000 includes Step 1012, singulation. Some embodiments may include calibration and chip programming, which may take into account the properties of the sensors. Methods described herein may be advantageous in glass substrate manufacturing processes because uniformity in glass lithography capabilities is limited. As a further advantage, glass has a lower thermal conductivity and so a glass substrate can be a better thermal insulator; by manufacturing thin structures separating a bolometer pixel from a glass substrate, embodiments herein may better serve to thermally isolate the glass bolometer pixel from the packaging environment.

Method 1000 includes Step 1014, attachment of a readout integrated circuit (ROIC) and flex/PCB attachment. As non-limiting examples, the readout circuits could be associated with devices or systems described herein. Processes and devices described herein may have the further advantage that the area required for signal processing can be much smaller than the sensing area which is dictated by the sensing physics. Typically, sensors are integrated on top of CMOS circuitry, and area driven costs lead to a technology node that is not optimal for the signal processing task. Processes described herein can use a more suitable CMOS and drive down the area required for signal processing, freeing the sensor from any area constraints by leveraging the low cost of FPD (flat panel display) manufacturing. In some embodiments, the ROIC is specifically designed for sensing a specific electromagnetic wavelength (such as X-Rays, THz, LWIR).

Figure 11:
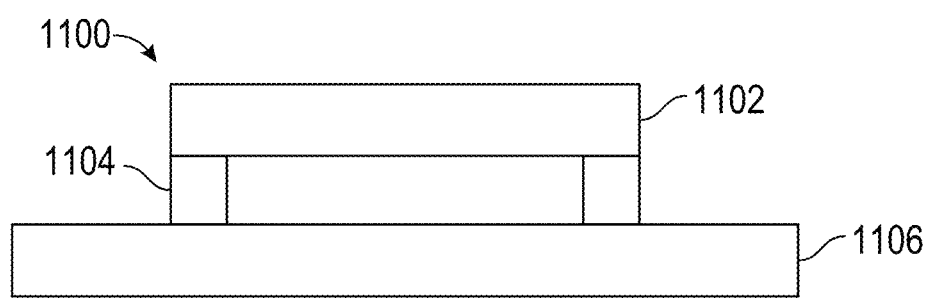
FIG. 11 illustrates an exemplary sensor, according to embodiments of the disclosure.

FIG. 11 illustrates an exemplary sensor. In some embodiments, sensor 1100 is manufactured using method 1000. Sensor 1100 includes glass substrate 1106, structure 1104 less than 250 nm wide coupled to glass substrate 1106, and a sensor pixel 1102 coupled to the structure 1104. In some embodiments of sensor 1100, structure 1104 is a hinge that thermally separates the active area from the glass. In some embodiments, sensor 1100 receives an input current or charge and outputs an output current or charge based on the received radiation (e.g., the resistance between two terminals of the sensor changes in response to exposure to LWIR radiation).

In some embodiments, a sensor includes a glass substrate, a structure manufactured from any of the methods described herein and coupled to the glass substrate, and a sensor pixel coupled to the structure.

In some embodiments, a sensor includes a MEMS or NEMS device manufactured by a LCD-TFT manufacturing process and a structure manufactured by any of the methods described herein.

By way of examples, sensors can include resistive sensors and capacitive sensors. Bolometers can be used in a variety of applications. For example, long wave infra-red (LWIR, wavelength of approximately 8-14 μm) bolometers can be used in the automotive and commercial security industries. For example, LWIR bolometers with QVGA, VGA, and other resolution. Terahertz (THz, wavelength of approximately 1.0-0.1 mm) bolometers can be used in security (e.g., airport passenger security screening) and medical (medical imaging). For example, THz bolometers with QVGA resolution and other resolutions. Some electrochemical systems can include X-Ray sensors or camera systems. Similarly, LWIR and THz sensors are used in camera systems. Some electromechanical systems are applied in medical imaging, such as endoscopes and exoscopes. X-ray sensors include direct and indirect sensing configurations.

Other electromechanical systems include scanners for light detection and ranging (LIDAR) systems. For example, optical scanners where spatial properties of a laser beam could be shaped (for, e.g., beam pointing). Electromechanical systems include inertial sensors (e.g., where the input stimulus is linear or angular motion). Some systems may be used in bio sensing and bio therapeutic platforms (e.g., where biochemical agents are detected).

In some embodiments, a non-transitory computer readable storage medium stores one or more programs, and the one or more programs includes instructions. When the instructions are executed by an electronic device (e.g., MEMS device 100, MEMS device 150, MEMS device 200, MEMS device 300, MEMS device 400, MEMS device 500) with one or more processors and memory, the instructions cause the electronic device to perform the methods described with respect to FIGS. 1A, 1B, 2, 3A, 3B, 5A, 5B, and 6.

Although "electrically coupled" and "coupled" are used to describe the electrical connections between two electronic components or elements in this disclosure, it is understood that the electrical connections do not necessarily need direct connection between the terminals of the components or elements being coupled together. For example, electrical routing connects between the terminals of the components or elements being electrically coupled together. In another example, a closed (conducting or an "on") switch is connected between the terminals of the components being coupled together. In yet another example, additional elements connect between the terminals of the components being coupled together without affecting the characteristics of the circuit. For example, buffers, amplifiers, and passive circuit elements can be added between components or elements being coupled together without affecting the characteristics of the disclosed circuits and departing from the scope of this disclosure.

In one aspect, a MEMS device includes a glass substrate; an electrode on the glass substrate; a hinge mechanically coupled to the electrode; a membrane mirror mechanically coupled to the hinge; a TFT on the glass substrate and electrically coupled to the electrode; and a control circuit comprising: a multiplexer configured to turn on or turn off the TFT; and a drive source configured to provide a drive signal for charging the electrode through the TFT. An amplitude of the drive signal corresponds to an amount of charge, and the amount of charge generates an electrostatic force for actuating the hinge and a portion of the membrane mirror mechanically coupled to the hinge.

In one aspect, a method of operating a MEMS device includes: measuring, through a glass substrate and an electrode, a gap between the electrode and a portion of a membrane mirror; determining, based on the measured gap, an amount of charge for generating an electrostatic force for actuating the portion of the membrane mirror; driving the electrode with a drive signal having an amplitude to charge the electrode to the amount of charge; generating, with the amount of charge, the electrostatic force; and actuating, using the electrostatic force, the portion of the membrane mirror.

In one aspect, a method of manufacturing a MEMS device, includes: providing a glass substrate; depositing an electrode on the glass substrate; depositing a first sacrificial layer; forming a hinge, wherein the hinge is mechanically coupled to the electrode; depositing a second sacrificial layer; depositing a membrane mirror above the second sacrificial layer, wherein the membrane mirror is mechanically coupled to the hinge; and releasing the first and second sacrificial layers.

In one aspect, a MEMS device includes: a glass substrate; an electrode on the glass substrate; a hinge mechanically coupled to the electrode; a membrane mirror mechanically coupled to the hinge; a TFT on the glass substrate and electrically coupled to the electrode; an opening in the glass substrate, in the membrane mirror, or in both; and a control circuit comprising: a multiplexer configured to turn on or turn off the TFT; and a drive source configured to provide a drive signal for charging the electrode through the TFT, wherein: an amplitude of the drive signal corresponds to an amount of charge, and the amount of charge generates an electrostatic force for actuating the hinge and a portion of the membrane mirror mechanically coupled to the hinge.

In one aspect, a method of manufacturing a MEMS device includes: providing a glass substrate; depositing an electrode on the glass substrate; depositing a first sacrificial layer; forming a hinge, wherein the hinge is mechanically coupled to the electrode; depositing a second sacrificial layer; depositing a membrane mirror above the second sacrificial layer, wherein the membrane mirror is mechanically coupled to the hinge; releasing the first and second sacrificial layers; and creating openings in the glass substrate, in the membrane mirror, or in both, wherein releasing the first and second sacrificial layers comprises releasing the first and second sacrificial layers through the openings.

In one aspect, a MEMS device includes: a pixel comprising a gap and configured to store an amount of charge, wherein the amount of charge generates an electrostatic force corresponding to a distance of the gap; a pixel switch electrically coupled to the electrode; and an intermediate capacitor electrically coupled to the pixel switch.

In one aspect, a method of operating a MEMS device includes: setting a voltage of an intermediate capacitor; and electrically coupling the intermediate capacitor to a pixel at a first gap, wherein: the voltage and electrical coupling cause a charge transfer between the intermediate capacitor and the pixel, and the charge transfer causes a change in an electrostatic force of the pixel and the pixel to change from the first gap to a second gap.

Those skilled in the art will recognize that the systems described herein are representative, and deviations from the explicitly disclosed embodiments are within the scope of the disclosure. For example, some embodiments include additional sensors or cameras, such as cameras covering other parts of the electromagnetic spectrum, can be devised using the same principles.

Although the disclosed embodiments have been fully described with reference to the accompanying drawings, it is to be noted that various changes and modifications will become apparent to those skilled in the art. Such changes and modifications are to be understood as being included within the scope of the disclosed embodiments as defined by the appended claims.

The terminology used in the description of the various described embodiments herein is for the purpose of describing particular embodiments only and is not intended to be limiting. As used in the description of the various described embodiments and the appended claims, the singular forms "a", "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

We claim:

1. A microelectromechanical system (MEMS) device, comprising:
   a pixel comprising a gap and configured to store an amount of charge, wherein the amount of charge generates an electrostatic force corresponding to a distance of the gap;
   a pixel switch electrically coupled to the pixel;
   an intermediate capacitor electrically coupled to the pixel switch;
   a data line;
   a second capacitor;
   a second switch configured to electrically couple the data line and the second capacitor; and
   a third switch configured to electrically couple the second capacitor and the intermediate capacitor.

2. The MEMS device of claim 1, further comprising:
   a sensing transistor electrically coupled to the intermediate capacitor; and
   a fourth switch configured to electrically couple the sensing transistor to a measurement line.

3. The MEMS device of claim 1, wherein the pixel is disposed on a glass substrate.

4. The MEMS device of claim 3, wherein the glass substrate comprises an opening.

5. The MEMS device of claim 1, further comprising:
   a hinge mechanically coupled to the pixel, and
   a membrane mirror mechanically coupled to the hinge.

6. The MEMS device of claim 5, wherein the membrane mirror comprises an opening.

7. The MEMS device of claim 1, wherein the pixel switch comprises a TFT on a glass substrate.

8. A method of operating a MEMS device, comprising:
   setting a voltage of an intermediate capacitor;
   electrically coupling the intermediate capacitor to a pixel at a first gap, wherein:
   the voltage and electrical coupling cause a charge transfer between the intermediate capacitor and the pixel, and
   the charge transfer causes a change in an electrostatic force of the pixel and the pixel to change from the first gap to a second gap;
   setting a second voltage of a second capacitor;
   electrically coupling the second capacitor to the intermediate capacitor to set the first voltage of the intermediate capacitor;
   prior to electrically coupling the second capacitor to the intermediate capacitor to set the first voltage of the intermediate capacitor, the intermediate capacitor is at a third voltage, and
   the first voltage of the intermediate capacitor is an equilibrium voltage between the electrically coupled second capacitor and the intermediate capacitor.

9. The method of claim 8, further comprising measuring the voltage of the intermediate capacitor.

10. A method of operating a MEMS device, comprising:
    setting a voltage of an intermediate capacitor;

electrically coupling the intermediate capacitor to a pixel at a first gap, wherein:
the voltage and electrical coupling cause a charge transfer between the intermediate capacitor and the pixel, and
the charge transfer causes a change in an electrostatic force of the pixel and the pixel to change from the first gap to a second gap;
setting a second voltage of a second capacitor;
electrically coupling the second capacitor to the intermediate capacitor to set the first voltage of the intermediate capacitor; and
prior to setting the second voltage of the second capacitor, setting the second capacitor and the intermediate capacitor to a fourth voltage.

11. A method of manufacturing a MEMS device, comprising:
providing a pixel comprising a gap and configured to store an amount of charge, wherein the amount of charge generates an electrostatic force corresponding to a distance of the gap;
providing a pixel switch;
electrically coupling the pixel switch to the pixel;
providing an intermediate capacitor;
electrically coupling the intermediate capacitor to the pixel switch;
providing a glass substrate;
depositing the electrode on the glass substrate; and
creating openings in the glass substrate, wherein the openings are configured for release of a sacrificial layer.

12. The method of claim 11, further comprising:
forming a hinge; and
mechanically coupling the hinge to the pixel.

13. The method of claim 12, further comprising mechanically coupling a membrane mirror to the hinge.

14. The method of claim 11, further comprising:
depositing a sacrificial layer; and
depositing a membrane mirror above the sacrificial layer.

15. The method of claim 14, further comprising:
creating openings in the membrane mirror, wherein the openings are configured for release of a sacrificial layer.

* * * * *